(12) United States Patent
Haba et al.

(10) Patent No.: US 9,287,216 B2
(45) Date of Patent: *Mar. 15, 2016

(54) MEMORY MODULE IN A PACKAGE

(71) Applicant: Invensas Corporation, San Jose, CA (US)

(72) Inventors: Belgacem Haba, Saratoga, CA (US); Wael Zohni, San Jose, CA (US); Richard Dewitt Crisp, Hornitos, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/472,991

(22) Filed: Aug. 29, 2014

(65) Prior Publication Data

US 2014/0367866 A1 Dec. 18, 2014

Related U.S. Application Data

(63) Continuation of application No. 13/346,185, filed on Jan. 9, 2012, now Pat. No. 8,823,165.

(60) Provisional application No. 61/542,488, filed on Oct. 3, 2011, provisional application No. 61/542,553, filed on Oct. 3, 2011, provisional application No. 61/542,495, filed on Oct. 3, 2011, provisional application No. 61/506,889, filed on Jul. 12, 2011.

(51) Int. Cl.
*H01L 23/538* (2006.01)
*H01L 25/065* (2006.01)
(Continued)

(52) U.S. Cl.
CPC .............. *H01L 23/5386* (2013.01); *G11C 5/04* (2013.01); *H01L 23/12* (2013.01); *H01L 23/538* (2013.01);
(Continued)

(58) Field of Classification Search
CPC ........... H01L 2224/48227; H01L 2224/32145; H01L 2924/15311; H01L 25/0657; H01L 2224/48145; H01L 23/3128; H01L 2224/97; H01L 25/06; H01L 23/12; H01L 23/13; H01L 23/48; H01L 23/481; H01L 23/482; H01L 23/485; H01L 23/488; H01L 23/498; H01L 23/49816; H01L 23/49838; H01L 23/52; H01L 23/538; H01L 23/5389; H01L 23/5386
USPC ......... 257/678, 684, 685, 686, 723, 777, 778, 257/780, E23.001, E23.003, E23.023, 257/E23.024, E23.038, E23.169
See application file for complete search history.

(56) References Cited

U.S. PATENT DOCUMENTS 3,670,208 A 6/1972 Hovnanian et al.
4,747,081 A 5/1988 Heilveil et al.
(Continued)

FOREIGN PATENT DOCUMENTS

EP 1205977 A2 5/2002
JP 64-001257 A 1/1989
(Continued)

OTHER PUBLICATIONS

Elpida User's Manual, "Introduction to GDDR5 SGRAM", Document No. E1600E10 (Ver. 1.0), Published Mar. 2010, Japan, URL: http:'www.elpida.com.
(Continued)

*Primary Examiner* — Eduardo A Rodela
(74) *Attorney, Agent, or Firm* — Lerner, David, Littenberg, Krumholz & Mentlik, LLP

(57) ABSTRACT

A microelectronic package can include a substrate having first and second opposed surfaces, at least two pairs of microelectronic elements, and a plurality of terminals exposed at the second surface. Each pair of microelectronic elements can include an upper microelectronic element and a lower microelectronic element. The pairs of microelectronic elements can be fully spaced apart from one another in a horizontal direction parallel to the first surface of the substrate. Each lower microelectronic element can have a front surface facing the first surface of the substrate and a plurality of contacts at the front surface. A surface of each of the upper microelectronic elements can at least partially overlie a rear surface of the lower microelectronic element in its pair. The microelectronic package can also include electrical connections extending from at least some of the contacts of each lower microelectronic element to at least some of the terminals.

19 Claims, 13 Drawing Sheets

(51) Int. Cl.

| | | |
|---|---|---|
| *G11C 5/04* | (2006.01) | |
| *H01L 23/12* | (2006.01) | |
| *H01L 27/108* | (2006.01) | |
| *H01L 23/31* | (2006.01) | |
| *H01L 23/00* | (2006.01) | |
| *H01L 25/18* | (2006.01) | |
| *H01L 23/13* | (2006.01) | |
| *H01L 23/36* | (2006.01) | |
| *H01L 23/498* | (2006.01) | |

(52) U.S. Cl.
CPC ............. *H01L 24/06* (2013.01); *H01L 24/09* (2013.01); *H01L 25/0652* (2013.01); *H01L 27/108* (2013.01); *H01L 23/13* (2013.01); *H01L 23/3128* (2013.01); *H01L 23/36* (2013.01); *H01L 23/49838* (2013.01); *H01L 24/29* (2013.01); *H01L 24/48* (2013.01); *H01L 25/0655* (2013.01); *H01L 25/0657* (2013.01); *H01L 25/18* (2013.01); *H01L 2224/0401* (2013.01); *H01L 2224/061* (2013.01); *H01L 2224/091* (2013.01); *H01L 2224/16225* (2013.01); *H01L 2224/16227* (2013.01); *H01L 2224/291* (2013.01); *H01L 2224/2919* (2013.01); *H01L 2224/29193* (2013.01); *H01L 2224/32145* (2013.01); *H01L 2224/32225* (2013.01); *H01L 2224/4824* (2013.01); *H01L 2224/48145* (2013.01); *H01L 2224/48227* (2013.01); *H01L 2224/73204* (2013.01); *H01L 2224/73215* (2013.01); *H01L 2224/73253* (2013.01); *H01L 2224/73265* (2013.01); *H01L 2225/0651* (2013.01); *H01L 2225/06506* (2013.01); *H01L 2225/06517* (2013.01); *H01L 2225/06541* (2013.01); *H01L 2225/06562* (2013.01); *H01L 2225/06589* (2013.01); *H01L 2924/01322* (2013.01); *H01L 2924/1203* (2013.01); *H01L 2924/1205* (2013.01); *H01L 2924/1431* (2013.01); *H01L 2924/1432* (2013.01); *H01L 2924/1433* (2013.01); *H01L 2924/1434* (2013.01); *H01L 2924/1436* (2013.01); *H01L 2924/1438* (2013.01); *H01L 2924/1443* (2013.01); *H01L 2924/14335* (2013.01); *H01L 2924/157* (2013.01); *H01L 2924/1579* (2013.01); *H01L 2924/15311* (2013.01); *H01L 2924/15312* (2013.01); *H01L 2924/15313* (2013.01); *H01L 2924/15786* (2013.01); *H01L 2924/15787* (2013.01); *H01L 2924/15788* (2013.01); *H01L 2924/181* (2013.01); *H01L 2924/18161* (2013.01); *H01L 2924/18165* (2013.01); *H01L 2924/19041* (2013.01); *H01L 2924/19105* (2013.01); *H01L 2924/301* (2013.01)

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,163,024 A | 11/1992 | Heilveil et al. | |
| 5,210,639 A | 5/1993 | Redwine et al. | |
| 5,480,840 A | 1/1996 | Barnes et al. | |
| 5,679,977 A | 10/1997 | Khandros et al. | |
| 5,691,570 A | 11/1997 | Kozuka | |
| 5,751,553 A | 5/1998 | Clayton | |
| 5,777,391 A | 7/1998 | Nakamura et al. | |
| 5,821,614 A | 10/1998 | Hashimoto et al. | |
| 5,899,705 A * | 5/1999 | Akram | 438/107 |
| 5,929,517 A | 7/1999 | Distefano et al. | |
| 5,936,305 A | 8/1999 | Akram | |
| 5,973,403 A | 10/1999 | Wark | |
| 6,086,386 A | 7/2000 | Fjelstad et al. | |
| 6,130,116 A | 10/2000 | Smith et al. | |
| 6,159,837 A | 12/2000 | Yamaji et al. | |
| 6,197,665 B1 | 3/2001 | DiStefano et al. | |
| 6,252,264 B1 | 6/2001 | Bailey et al. | |
| 6,255,899 B1 | 7/2001 | Bertin et al. | |
| 6,261,867 B1 | 7/2001 | Robichaud et al. | |
| 6,297,960 B1 | 10/2001 | Moden et al. | |
| 6,323,436 B1 | 11/2001 | Hedrick et al. | |
| 6,343,019 B1 | 1/2002 | Jiang et al. | |
| 6,376,769 B1 | 4/2002 | Chung | |
| 6,380,318 B1 | 4/2002 | Saito et al. | |
| 6,384,473 B1 | 5/2002 | Peterson et al. | |
| 6,426,560 B1 | 7/2002 | Kawamura et al. | |
| 6,433,422 B1 | 8/2002 | Yamasaki | |
| 6,445,594 B1 | 9/2002 | Nakagawa et al. | |
| 6,452,266 B1 | 9/2002 | Iwaya et al. | |
| 6,461,895 B1 | 10/2002 | Liang et al. | |
| 6,462,423 B1 | 10/2002 | Akram et al. | |
| 6,521,981 B2 | 2/2003 | Miyazaki et al. | |
| 6,560,134 B2 | 5/2003 | Brox et al. | |
| 6,577,004 B1 | 6/2003 | Rumsey et al. | |
| 6,611,057 B2 | 8/2003 | Mikubo et al. | |
| 6,617,695 B1 | 9/2003 | Kasatani | |
| 6,619,973 B2 | 9/2003 | Perino et al. | |
| 6,620,648 B2 | 9/2003 | Yang | |
| 6,633,078 B2 | 10/2003 | Hamaguchi et al. | |
| 6,658,530 B1 * | 12/2003 | Robertson et al. | 711/115 |
| 6,661,089 B2 | 12/2003 | Huang | |
| 6,692,987 B2 | 2/2004 | Lim et al. | |
| 6,707,141 B2 | 3/2004 | Akram | |
| 6,720,666 B2 | 4/2004 | Lim et al. | |
| 6,742,098 B1 | 5/2004 | Halbert et al. | |
| 6,744,137 B2 | 6/2004 | Kinsman | |
| 6,765,288 B2 | 7/2004 | Damberg | |
| 6,781,220 B2 | 8/2004 | Taube et al. | |
| 6,821,815 B2 | 11/2004 | Smith et al. | |
| 6,836,007 B2 | 12/2004 | Michii et al. | |
| 6,876,088 B2 | 4/2005 | Harvey | |
| 6,894,379 B2 | 5/2005 | Feurle | |
| 6,894,381 B2 | 5/2005 | Hetzel et al. | |
| 6,906,415 B2 | 6/2005 | Jiang et al. | |
| 6,943,057 B1 | 9/2005 | Shim et al. | |
| 6,977,440 B2 | 12/2005 | Pflughaupt et al. | |
| 6,982,485 B1 | 1/2006 | Lee et al. | |
| 7,061,092 B2 | 6/2006 | Akram et al. | |
| 7,061,105 B2 | 6/2006 | Masuda et al. | |
| 7,061,121 B2 | 6/2006 | Haba | |
| 7,091,064 B2 | 8/2006 | Jiang | |
| 7,122,897 B2 | 10/2006 | Aiba et al. | |
| 7,123,497 B2 | 10/2006 | Matsui et al. | |
| 7,138,709 B2 | 11/2006 | Kumamoto | |
| 7,141,879 B2 | 11/2006 | Wakamiya et al. | |
| 7,145,226 B2 | 12/2006 | Kumamoto | |
| 7,151,319 B2 | 12/2006 | Iida et al. | |
| 7,164,149 B2 | 1/2007 | Matsubara | |
| 7,170,158 B2 | 1/2007 | Choi et al. | |
| 7,262,507 B2 | 8/2007 | Hino et al. | |
| 7,272,888 B2 | 9/2007 | DiStefano | |
| 7,294,928 B2 | 11/2007 | Bang et al. | |
| 7,324,352 B2 | 1/2008 | Goodwin | |
| 7,368,319 B2 | 5/2008 | Ha et al. | |
| 7,372,169 B2 | 5/2008 | Chang | |
| 7,389,937 B2 | 6/2008 | Ito | |
| 7,405,471 B2 | 7/2008 | Kledzik et al. | |
| 7,414,312 B2 | 8/2008 | Nguyen et al. | |
| 7,420,284 B2 | 9/2008 | Miyazaki et al. | |
| 7,476,975 B2 | 1/2009 | Ogata | |
| 7,518,226 B2 | 4/2009 | Cablao et al. | |
| 7,535,110 B2 | 5/2009 | Wu et al. | |
| 7,550,842 B2 | 6/2009 | Khandros et al. | |
| 7,589,409 B2 | 9/2009 | Gibson et al. | |
| 7,633,146 B2 | 12/2009 | Masuda et al. | |
| 7,633,147 B2 | 12/2009 | Funaba et al. | |
| 7,642,635 B2 | 1/2010 | Kikuchi et al. | |
| 7,692,931 B2 | 4/2010 | Chong et al. | |
| 7,763,964 B2 | 7/2010 | Matsushima | |

(56) References Cited

U.S. PATENT DOCUMENTS

| | | |
|---|---|---|
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 * | 3/2012 | Joseph et al. ............... 438/106 |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,823,165 B2 * | 9/2014 | Haba et al. ............... 257/723 |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 * | 9/2008 | Sasaki ............... 257/686 |
| 2008/0256281 A1 | 10/2008 | Fahr et al. |
| 2008/0265397 A1 | 10/2008 | Lin et al. |
| 2009/0065948 A1 * | 3/2009 | Wang ............... 257/777 |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0294938 A1 | 12/2009 | Chen |
| 2009/0314538 A1 | 12/2009 | Jomaa et al. |
| 2010/0052111 A1 | 3/2010 | Urakawa |
| 2010/0102428 A1 * | 4/2010 | Lee et al. ............... 257/686 |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 * | 11/2010 | Kim ............... 257/692 |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 * | 4/2011 | Shibata et al. ............... 327/565 |
| 2011/0110165 A1 | 5/2011 | Gillingham et al. |
| 2011/0140247 A1 | 6/2011 | Pagaila et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0206181 A1 | 8/2012 | Lin et al. |
| 2012/0217645 A1 | 8/2012 | Pagaila |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |

FOREIGN PATENT DOCUMENTS

| | | |
|---|---|---|
| JP | 2002-076252 A | 3/2002 |
| JP | 2004-063767 A | 2/2004 |
| JP | 2008-198841 A | 8/2008 |
| JP | 3143893 U | 8/2008 |
| JP | 2010-098098 A | 4/2010 |
| KR | 2001-0002214 A | 1/2001 |
| KR | 2005-0119414 A | 12/2005 |
| KR | 2006-0120365 A | 11/2006 |
| KR | 2007-0088177 A | 8/2007 |
| KR | 2009-0008341 A | 1/2009 |
| KR | 2009-0086314 A | 8/2009 |

(56) References Cited

FOREIGN PATENT DOCUMENTS

| | | |
|---|---|---|
| TW | 312044 | 8/1997 |
| TW | 428258 | 4/2001 |
| TW | 429561 | 4/2001 |
| TW | 478137 B | 3/2002 |
| TW | 567593 B | 12/2003 |
| TW | M338433 U | 8/2008 |
| TW | 200842998 A | 11/2008 |
| TW | 200901194 A | 1/2009 |
| TW | 200926312 A | 6/2009 |
| TW | M363079 U | 8/2009 |
| TW | M398313 | 2/2011 |
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

Hynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application PCT/US2013/056777 dated Jan. 2, 2014.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Office Action from Taiwan for Application No. 101125197 dated May 19, 2014.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.
Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
U.S. Appl. No. 61/477,877, filed Apr. 21, 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
Taiwanese Allowance and Search Report for Application No. 101136592 dated Jun. 27, 2014.
Taiwanese Office Action for Application No. 101136594 dated Aug. 13, 2014.
Taiwanese Office Action for Application No. 101136595 dated Oct. 27, 2014.
International Search Report and Written Opinion for Application No. PCT/US2014/041709 dated Nov. 4, 2014.

(56) References Cited

OTHER PUBLICATIONS

Taiwanese Office Action for Application No. 101136575 dated Oct. 28, 2014.
International Search Report and Written Opinion for Application No. PCT/US2013/056777 dated Jan. 21, 2015.
Taiwanese Office Action for Application No. 101136585 dated Jan. 21, 2015.
Taiwanese Notice of Allowance for Application No. 102130518 dated Mar. 31, 2015.
Taiwanese Office Action for Application No. 101136606 dated Mar. 27, 2015.
Taiwanese Office Action for Application No. 101136578 dated May 12, 2015.
Taiwanese Office Action for Application No. 101136577 dated May 12, 2015.
Taiwanese Office Action for Application No. 102130519 dated May 7, 2015.
Written Opinion of the International Preliminary Examining Authority for Application No. PCT/US2014/041709 dated Jun. 1, 2015.

* cited by examiner

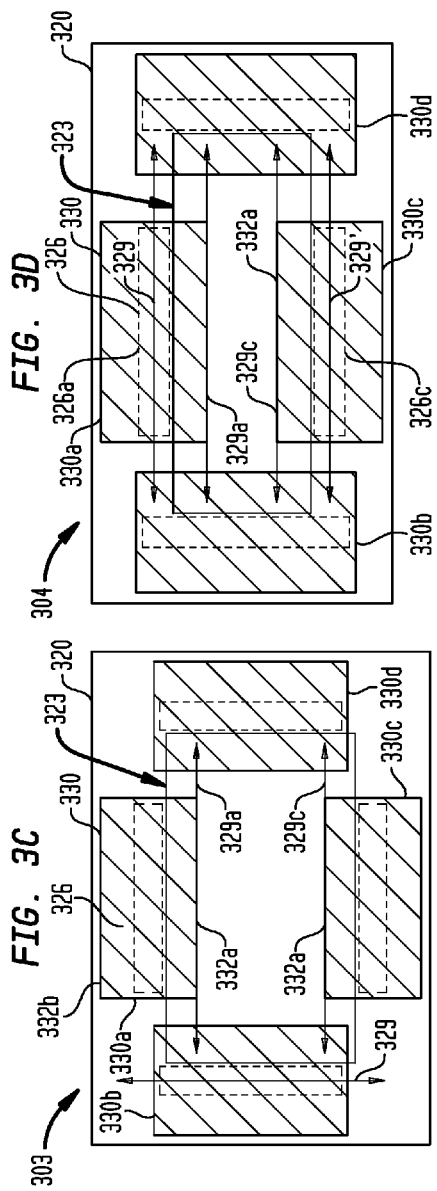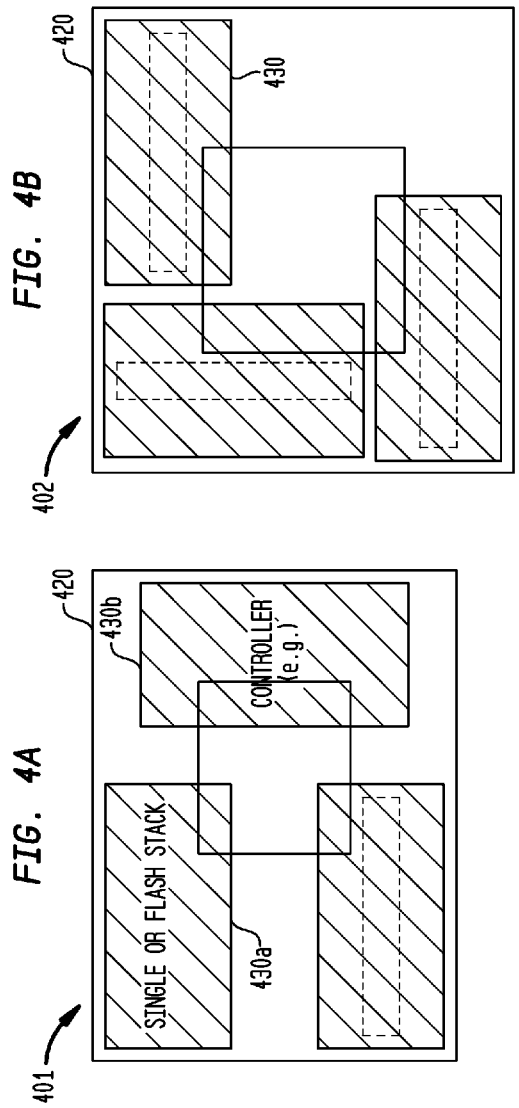

MEMORY MODULE IN A PACKAGE

CROSS-REFERENCE TO RELATED APPLICATIONS

The present application is a continuation of U.S. patent application Ser. No. 13/346,185 filed Jan. 9, 2012, which claims the benefit of the filing date of U.S. Provisional Patent Application No. 61/506,889 filed Jul. 12, 2011, and U.S. Provisional Patent Application Nos. 61/542,488, 61/542,495, and 61/542,553, all filed Oct. 3, 2011, the disclosures of which are hereby incorporated herein by reference.

BACKGROUND OF THE INVENTION

The subject matter of the present application relates to microelectronic packages and assemblies incorporating microelectronic packages.

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

In "flip chip" designs, the front face of the chip confronts the face of a package dielectric element, i.e., substrate of the package, and the contacts on the chip are bonded directly to contacts on the face of the substrate by solder bumps or other connecting elements. In turn, the substrate can be bonded to a circuit panel through the external terminals that overlie the substrate. The "flip chip" design provides a relatively compact arrangement; each package occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference. Certain innovative mounting techniques offer compactness approaching or equal to that of conventional flip-chip bonding. Packages that can accommodate a single chip in an area of the circuit panel equal to or slightly larger than the area of the chip itself are commonly referred to as "chip-scale packages."

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single-chip or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds that extend in both horizontal and vertical directions relative to the surface of the chip.

The transmission of signals within packages to chips of multi-chip packages poses particular challenges, especially for signals common to two or more chips in the package such as clock signals, and address and strobe signals for memory chips. Within such multi-chip packages, the lengths of the connection paths between the terminals of the package and the chips can vary. The different path lengths can cause the signals to take longer or shorter times to travel between the terminals and each chip. Travel time of a signal from one point to another is called "propagation delay" and is a function of the conductor length, the conductor's structure, and other dielectric or conductive structure in close proximity therewith.

Differences in the times at which two different signals reach a particular location can also be called "skew". The skew in the arrival times of a particular signal at two or more locations is a result of both propagation delay and the times at which the particular signal starts to travel towards the locations. Skew may or may not impact circuit performance. Skew often has little impact on performance when all signals in a synchronous group of signals are skewed together, in which case all signals needed for operation arrive together when needed. However, this is not the case when different signals of a group of synchronous signals needed for operation arrive at different times. In this case the skew impacts performance because the operation cannot be performed unless all needed signals have arrived. The embodiments described herein can include features that minimize skew that are disclosed in the copending U.S. Provisional Patent Application No. 61/506,889 (TESSERA 3.8-664), the disclosure of which is incorporated by reference herein.

Conventional microelectronic packages can incorporate a microelectronic element that is configured to predominantly provide memory storage array function, i.e., a microelectronic element that embodies a greater number of active devices to provide memory storage array function than any other function. The microelectronic element may be or include a DRAM chip, or a stacked electrically interconnected assembly of such semiconductor chips. Typically, all of the terminals of such package are placed in sets of columns adjacent to one or more peripheral edges of a package substrate to which the microelectronic element is mounted.

In light of the foregoing, certain improvements can be made to multi-chip microelectronic packages and assemblies in order to improve electrical performance. These attributes of the present invention can be achieved by the construction of the microelectronic packages and assemblies as described hereinafter.

BRIEF SUMMARY OF THE INVENTION

In accordance with an aspect of the invention, a microelectronic package can include a substrate having first and second opposed surfaces, at least two pairs of microelectronic elements, each pair of microelectronic elements including an upper microelectronic element and a lower microelectronic element, a plurality of terminals exposed at the second surface, and electrical connections extending from at least some of contacts of each lower microelectronic element to at least some of the terminals. The pairs of microelectronic elements can be fully spaced apart from one another in a horizontal direction parallel to the first surface of the substrate. Each lower microelectronic element can have a front surface facing the first surface of the substrate and a plurality of contacts at the front surface. The front surfaces of the lower microelectronic elements can be arranged in a single plane parallel to the first surface. A surface of each of the upper microelectronic elements can at least partially overlie a rear surface of the lower microelectronic element in its pair. The microelectronic elements can together be configured to predominantly provide memory storage array function. The terminals can be configured for connecting the microelectronic package to at least one component external to the microelectronic package.

In a particular embodiment, at least some of the plurality of contacts of the lower microelectronic element of first and second ones of the pairs of microelectronic elements can be arranged in a respective column of contacts defining respective first and second axes. The first and second axes can be transverse to one another. In one example, the first and second axes can be orthogonal to one another. In an exemplary embodiment, at least some of the plurality of contacts of the lower microelectronic element of first and second ones of the pairs of microelectronic elements can be arranged in a respective column of contacts defining respective first and second axes. The first and second axes can be parallel to one another. In a particular example, the at least two pairs of microelectronic elements can include four pairs of microelectronic elements.

In one embodiment, at least some of the plurality of contacts of each of the lower microelectronic elements can be arranged in a column of contacts defining respective first, second, third, and fourth axes. The first and third axes can be parallel to one another. The second and fourth axes can be transverse to the first and third axes. In a particular embodiment, the lower microelectronic element of at least one of the pairs of the microelectronic elements can be a first lower microelectronic element disposed adjacent a second lower microelectronic element. The front surface of the second lower microelectronic element can be arranged in the single plane parallel to the first surface. The upper microelectronic element that at least partially overlies the first lower microelectronic element can also at least partially overlie the second lower microelectronic element.

In an exemplary embodiment, the terminals can be arranged in an area array. The terminals can have exposed contact surfaces that are coplanar with one another. In a particular example, the electrical connections can include flip-chip connections extending between contacts of each of the lower microelectronic elements and conductive bond pads exposed at the first surface of the substrate. In one embodiment, each of the lower microelectronic elements can overlie at least one aperture extending between the first and second surfaces of the substrate. The electrical connections can include leads having at least portions aligned with the at least one aperture. In a particular embodiment, each of the upper microelectronic elements can overlie at least one aperture extending between the first and second surfaces of the substrate. The electrical connections can include leads having at least portions aligned with the at least one aperture.

In one example, at least some of the leads can include wire bonds extending through at least one of the apertures. In an exemplary embodiment, all of the leads can be wire bonds extending through at least one of the apertures. In one embodiment, at least some of the leads can include lead bonds. In a particular example, each upper microelectronic element can have a plurality of contacts exposed at the front surface thereof and arranged in at least one column of contacts disposed adjacent to an edge of the front surface. Each column of contacts can be disposed beyond an edge of the corresponding one of the lower microelectronic elements.

In a particular embodiment, the microelectronic package can include four pairs of microelectronic elements. The contacts of each microelectronic element can include eight data I/O contacts. Alternatively, the contacts of each microelectronic element can include nine data I/O contacts. In one embodiment, the microelectronic package can include nine microelectronic elements. The contacts of each microelectronic element can include eight data I/O contacts. In an exemplary embodiment, the microelectronic package can include two pairs of microelectronic elements. The contacts of each microelectronic element can include eight data I/O contacts. Alternatively, the contacts of each microelectronic element include sixteen data I/O contacts.

In one example, the microelectronic package can also include a buffer element electrically connected to at least some of the terminals and one or more of the microelectronic elements in the microelectronic package. The buffer element can be configured to regenerate at least one signal received at one or more of the terminals of the microelectronic package. In a particular embodiment, the buffer element can be mounted to the first surface of the substrate. In an exemplary embodiment, the buffer element can be mounted to the second surface of the substrate. In one embodiment, the at least one signal can include all of the address signals transferred to the microelectronic package. In a particular example, the at least one signal can include all of the command signals, address signals, bank address signals, and clock signals transferred to the microelectronic package, the command signals being write enable, row address strobe, and column address strobe signals, and the clock signals being sampling clocks used for sampling the address signals.

In an exemplary embodiment, the at least one signal can include all of the data signals received by the microelectronic package. In one embodiment, the microelectronic package can also include a nonvolatile memory element mounted to the substrate and configured to store identifying information. The nonvolatile memory element can be electrically connected to one or more of the microelectronic elements. In a particular example, the microelectronic package can also include a temperature sensor. In a particular embodiment, the microelectronic element can also include a decoupling capacitor element mounted to the substrate. The decoupling capacitor element can be electrically connected to one or more of the microelectronic elements. In one embodiment, the substrate can be an element consisting essentially of a material having a CTE in a plane of the substrate less than 12 ppm/° C. In a particular embodiment, the substrate can include a dielectric element consisting essentially of a material having a CTE in a plane of the substrate less than 30 ppm/° C.

In one example, the microelectronic elements can be configured to function together as an addressable memory module. The microelectronic package can be configured to store part of data received in each of the microelectronic elements. In one embodiment, the microelectronic package can be configured to function as a dual in-line memory module. In an exemplary embodiment, the microelectronic package can have the same command and signal interface and is configured to transfer the same amount of data as a dual in-line memory module. In a particular embodiment, each of the microelectronic elements can be configured to predominantly provide memory storage array function. In one example, each of the microelectronic elements can include a dynamic random access memory ("DRAM") integrated circuit chip. In a particular example, each of the microelectronic elements can be functionally and mechanically equivalent to the other ones of the microelectronic elements.

In a particular embodiment, the second surface of the substrate can have a central region occupying a central portion thereof. At least some of the terminals can be first terminals disposed in the central region. In one embodiment, the at least two pairs of microelectronic elements can include four pairs of microelectronic elements. Each pair of microelectronic elements can at least partially overlie an aperture extending between the first and second surfaces of the substrate. Each aperture can have a length defining respective first, second, third, and fourth axes. The first and third axes can be parallel to one another. The second and fourth axes can be transverse to the first and third axes. The central region can be bounded by the first, second, third, and fourth axes.

In an exemplary embodiment, each said aperture can be an outer aperture. Each pair of microelectronic elements can at least partially overlie an inner aperture extending between the first and second surfaces of the substrate adjacent a corresponding one of the outer apertures. Each inner aperture can have a length defining an axis that is closer to a centroid of the substrate than the axis defined by the length of the corresponding one of the outer apertures. In one embodiment, the first terminals can be configured to carry all of the address signals transferred to the microelectronic package.

In a particular example, the first terminals can be configured to carry at least some of the command signals, address signals, bank address signals, and clock signals transferred to the microelectronic package, the command signals being write enable, row address strobe, and column address strobe signals, and the clock signals being sampling clocks used for sampling the address signals. The first terminals can be shared by at least two of the microelectronic elements. In one example, the first terminals can be shared by each of the microelectronic elements. In an exemplary embodiment, the microelectronic package can also include a heat spreader in thermal communication with at least one of the microelectronic elements. In a particular embodiment, the heat spreader can at least partially overlie a rear surface of each of the upper microelectronic elements. In one embodiment, the heat spreader can at least partially overlie the rear surface of each of the lower microelectronic elements.

In accordance with an aspect of the invention, a microelectronic assembly can include a plurality of microelectronic packages as described above. The microelectronic assembly can also include a circuit panel having panel contacts. The terminals of the package can be bonded to the panel contacts. In one embodiment, the circuit panel can have a common electrical interface for transport of signals to and from each of the microelectronic packages. In an exemplary embodiment, each of the microelectronic packages can be configured to have the same functionality as a dual in-line memory module. In a particular example, the circuit panel can be a motherboard. In one example, the circuit panel can be a module configured to be attached to a motherboard.

In a particular embodiment, the microelectronic assembly can also include a buffer element mounted to the circuit panel and electrically connected to at least some of the microelectronic packages. The buffer element can be configured to regenerate at least one signal received at one or more of the terminals of the microelectronic packages. In one example, the at least one signal can include all of the command signals, address signals, bank address signals, and clock signals transferred to the microelectronic assembly, the command signals being write enable, row address strobe, and column address strobe signals, and the clock signals being sampling clocks used for sampling the address signals. In an exemplary embodiment, the at least one signal can include all of the data signals received by the microelectronic assembly.

In accordance with an aspect of the invention, a module can include a plurality of microelectronic assemblies as described above. Each microelectronic assembly can be electrically coupled to a second circuit panel for transport of signals to and from each of the microelectronic assemblies. Further aspects of the invention can provide systems that incorporate microelectronic assemblies according to the foregoing aspects of the invention, composite chips according to the foregoing aspects of the invention, or both in conjunction with other electronic components electrically connected thereto. For example, the system can be disposed in and/or mounted to a single housing, which can be a portable housing. Systems according to preferred embodiments in this aspect of the invention can be more compact than comparable conventional systems.

BRIEF DESCRIPTION OF THE DRAWINGS

FIGS. 3A-3D are top views of microelectronic packages having four microelectronic elements according to further embodiments, showing the location of the bond windows and the central region.

FIGS. 4A and 4B are top views of microelectronic packages having three microelectronic elements according to still further embodiments, showing the location of the bond windows and the central region.

DETAILED DESCRIPTION

Figure 1A:
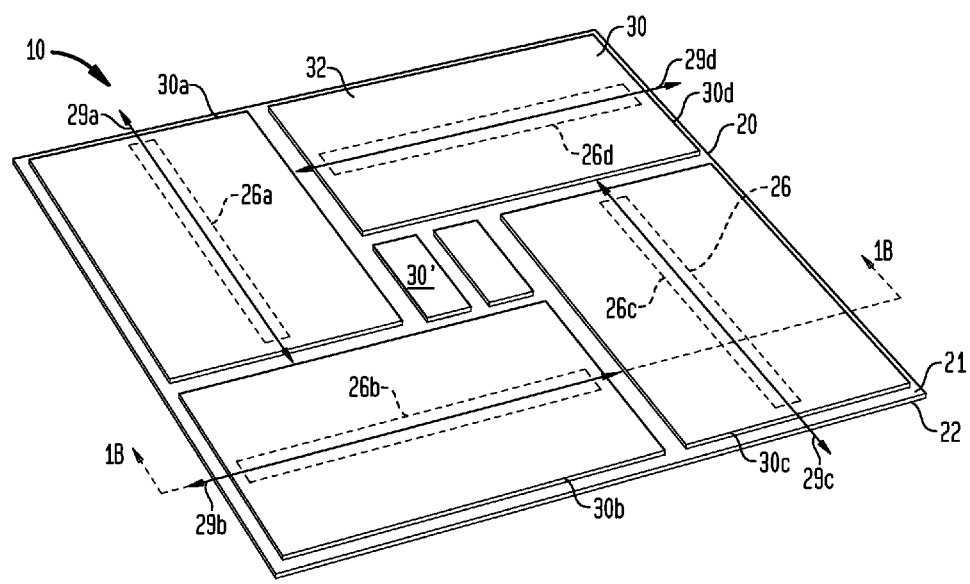
FIG. 1A is a diagrammatic perspective view of a microelectronic package according to an embodiment of the present invention.

Certain embodiments of the invention provide a package or microelectronic assembly in which a microelectronic element, e.g., a semiconductor chip, or stacked arrangement of semiconductor chips, is configured to predominantly provide a memory storage array function. In such microelectronic element, the number of active devices, e.g., transistors, therein that are configured, i.e., constructed and interconnected with other devices, to provide memory storage array function, is greater than the number of active devices that are configured to provide any other function. Thus, in one example, a microelectronic element such as a DRAM chip may have memory storage array function as its primary or sole function. Alternatively, in another example, such microelectronic element may have mixed use and may incorporate active devices configured to provide memory storage array function, and may also incorporate other active devices configured to provide another function such as processor function, or signal processor or graphics processor function, among others. In this case, the microelectronic element may still have a greater number of active devices configured to provide the memory storage array function than any other function of the microelectronic element.

Embodiments of the invention herein provide packages that have more than one semiconductor chip, i.e., a microelectronic element therein. A multiple chip package can reduce the amount of area or space required to connect the chips therein to a circuit panel, e.g., printed wiring board to which the package may be electrically and mechanically connected through an array of terminals, such as a ball grid array, land grid array or pin grid array, among others. Such connection space is particularly limited in small or portable computing devices, e.g., handheld devices such as "smartphones" or tablets that typically combine the function of personal computers with wireless connectivity to the broader world. Multichip packages can be particularly useful for making large amounts of relatively inexpensive memory available to a system, such as advanced high performance dynamic random access memory ("DRAM") chips, e.g., in DDR3 type DRAM chips and its follow-ons.

The amount of area of the circuit panel needed to connect the multi-chip package thereto can be reduced by providing common terminals on the package through which at least some signals travel on their way to or from two or more chips within the package. However, doing so in a way that supports high performance operation presents challenges. To avoid undesirable effects such as undesirable reflections of the signal due to unterminated stubs, the traces, vias, and other conductors on a circuit panel that electrically connect the terminals at the exterior of the package with the global wiring on the circuit panel must not be too long. Heat dissipation also presents a challenge for advanced chips, such that it is desirable for at least one of the large flat surfaces of each chip to be coupled to a heat spreader or be exposed to or in thermal communication with a flow or air within an installed system. The packages described below can help to further these goals.

Figure 1B:
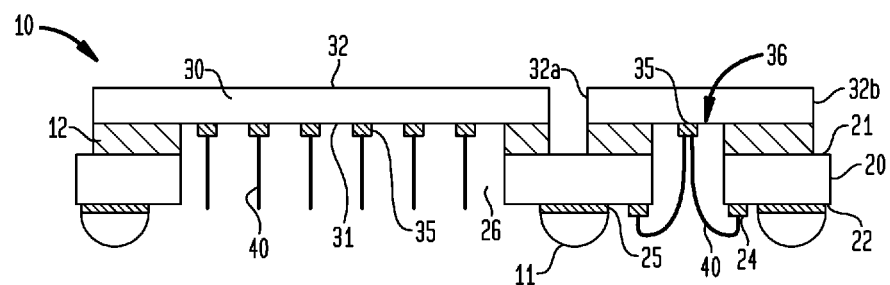
FIG. 1B is a side sectional view of the microelectronic package of FIG. 1A, taken along the line 1B-1B of FIG. 1A.
Figure 1C:
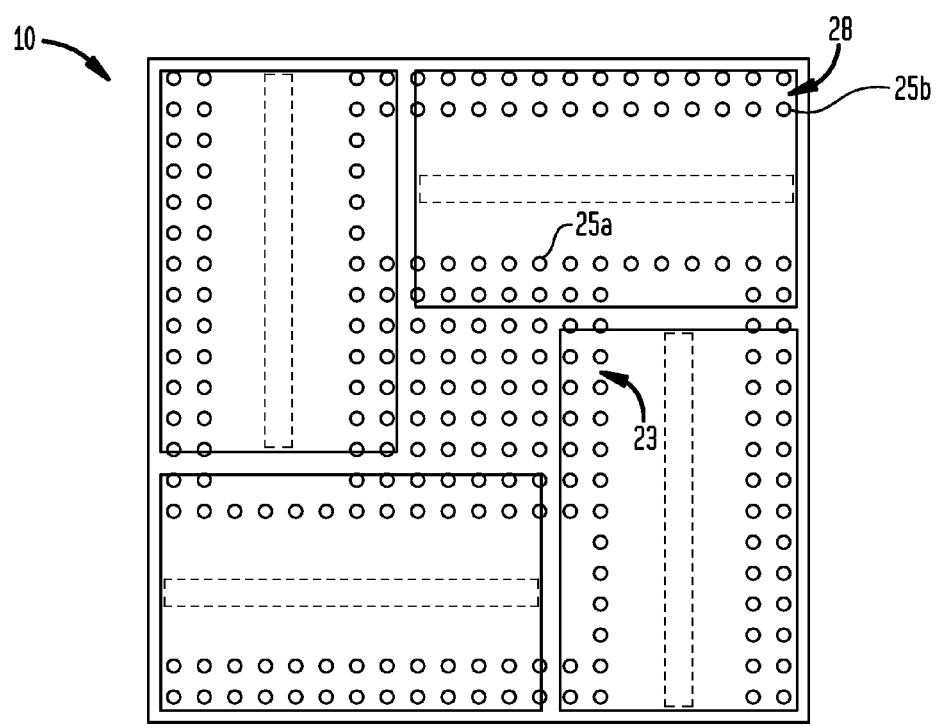
FIG. 1C is a bottom view of the microelectronic package of FIG. 1A, showing the location of the microelectronic elements.

FIGS. 1A-1C illustrate a particular type of microelectronic package 10 according to an embodiment of the invention. As seen in FIGS. 1A-1C, the microelectronic package 10 can include packaging structure, for example, a substrate 20 having first and second opposed surfaces 21 and 22. In some cases, the substrate 20 can consist essentially of a material having a low coefficient of thermal expansion ("CTE") in a plane of the substrate (in a direction parallel to the first surface 21 of the substrate), i.e., a CTE of less than 12 parts per million per degree Celsius (hereinafter, "ppm/° C."), such as a semiconductor material e.g., silicon, or a dielectric material such as ceramic material or silicon dioxide, e.g., glass. Alternatively, the substrate 20 may include a sheet-like substrate that can consist essentially of a polymeric material such as polyimide, epoxy, thermoplastic, thermoset plastic, or other suitable polymeric material or that includes or consists essentially of composite polymeric-inorganic material such as a glass reinforced structure of BT resin (bismaleimide triazine) or epoxy-glass, such as FR-4, among others. In one example, such a substrate 20 can consist essentially of a material having a CTE of less than 30 ppm/° C. in the plane of the substrate, i.e., in a direction along its surface.

In FIGS. 1A-1C, the directions parallel to the first surface 21 of the substrate 20 are referred to herein as "horizontal" or "lateral" directions, whereas the directions perpendicular to the first surface are referred to herein as upward or downward directions and are also referred to herein as the "vertical" directions. The directions referred to herein are in the frame of reference of the structures referred to. Thus, these directions may lie at any orientation to the normal "up" or "down" directions in a gravitational frame of reference.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

At least one aperture 26 can extend between the first and second surfaces 21, 22 of the substrate 20. As can be seen in FIG. 1A, the substrate 20 can have four apertures 26 extending therethrough. The substrate 20 can have a plurality of terminals 25, e.g., conductive pads, lands, or conductive posts or pins thereon. Such terminals 25 can be exposed at the second surface of the substrate 20. The terminals 25 can function as endpoints for the connection of the microelectronic package 10 with corresponding electrically conductive elements of an external component such as a circuit panel, e.g., printed wiring board, flexible circuit panel, socket, other microelectronic assembly or package, interposer, or passive component assembly, among others (e.g., the circuit panel shown in FIG. 8A). In one example, such a circuit panel can be a motherboard or DIMM module board. In a particular embodiment, the terminals can be arranged in an area array such as a ball-grid array (BGA) (including joining elements as described below), a land-grid array (LGA), or a pin-grid array (PGA), among others. In one embodiment, the terminals 25 can be arranged along the periphery of the second surface 22 of the substrate 20.

In an exemplary embodiment, the terminals 25 can include substantially rigid posts made from an electrically conductive material such as copper, copper alloy, gold, nickel, and the like. The terminals 25 can be formed, for example, by plating an electrically conductive material into openings in a resist mask, or by forming posts made, for example, of copper, copper alloy, nickel, or combinations thereof. Such posts can be formed, for example, by subtractively patterning a metal sheet or other metal structure into posts what extend away from the substrate 20 as terminals for electrically interconnecting the microelectronic package 10 with an external component such as the circuit panel 860 described below, for example. The terminals 25 can be substantially rigid posts having other configurations, as described for example in U.S. Pat. No. 6,177,636, the disclosure of which is hereby incorporated herein by reference. In one example, the terminals 25 can have exposed contact surfaces that are coplanar with one another.

The microelectronic package 10 can include joining elements 11 attached to the terminals 25 for connection with an external component. The joining elements 11 can be, for example, masses of a bond metal such as solder, tin, indium, a eutectic composition or combination thereof, or another joining material such as a conductive paste or a conductive adhesive. In a particular embodiment, the joints between the terminals 25 and contacts of an external component (e.g., the circuit panel 860 shown in FIG. 8A) can include an electrically conductive matrix material such as described in commonly owned U.S. patent application Ser. Nos. 13/155,719 and 13/158,797, the disclosures of which are hereby incorporated by reference herein. In a particular embodiment, the joints can have a similar structure or be formed in a manner as described therein.

As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure.

The terminals 25 can include first terminals 25a exposed in a central region 23 of the second surface 22 of the substrate 20 and second terminals 25b exposed in a peripheral region 28 of the second surface outside the central region. The arrangement shown in FIGS. 1A-1C can provide a compact arrangement of microelectronic elements 30 and a relatively expansive central region 23 without requiring a microelectronic element to overlie any other microelectronic element.

The first terminals 25a can be configured to carry all of the command signals, address signals, bank address signals, and clock signals transferred to the microelectronic package 10 from an external component. For example, in a microelectronic element that includes a dynamic memory storage array, e.g., for a dynamic random access memory ("DRAM"), the command signals are write enable, row address strobe, and column address strobe signals used by a microelectronic element within the microelectronic package 10, when such microelectronic element is a dynamic random access memory storage device. Other signals such as ODT (one die termination), chip select, clock enable, are not part of the command signals that need to be carried by the first terminals 25a.

The clock signals can be sampling clocks used for sampling the address signals. At least some of the second terminals 25b can be configured to carry signals other than the command signals, address signals, and clock signals that are carried by the first terminals 25a. Signals or reference potentials such as chip select, reset, power supply voltages, e.g., Vdd, Vddq, and ground, e.g., Vss and Vssq, can be carried by the second terminals 25b; none of these signals or reference potentials needs to be carried by the first terminals 25a.

In a particular example, such as the example shown in FIG. 1C, the second terminals 25b can be disposed in at least one column in each peripheral region 28. In one embodiment, at least some of the second terminals 25b that are configured to carry signals other than the command signals, address signals, and clock signals can be exposed in the central region 23 of the second surface 22 of the substrate 20.

The microelectronic package 10 can also include a plurality of microelectronic elements 30 each having a front surface 31 facing the first surface 21 of the substrate 20. In one example, each of the microelectronic elements 30 can be bare chips or microelectronic units each incorporating a memory storage element such as a dynamic random access memory ("DRAM") storage array or that is configured to predominantly function as a DRAM storage array (e.g., a DRAM integrated circuit chip). As used herein, a "memory storage element" refers to a multiplicity of memory cells arranged in an array, together with circuitry usable to store and retrieve data therefrom, such as for transport of the data over an electrical interface. In a particular example, the microelectronic package 10 can be included in a single in-line memory module ("SIMM") or a dual in-line memory module ("DIMM").

In a particular example, a microelectronic element 30 that includes a memory storage element can have at least a memory storage array function, but the microelectronic element may not be a full-function memory chip. Such a microelectronic element may not have a buffering function itself, but it may be electrically connected to other microelectronic elements in a stack of microelectronic elements, wherein at least one microelectronic element in the stack has a buffering function (the buffering microelectronic element could be a buffer chip, a full-function memory chip, or a controller chip).

In other examples, one or more of the microelectronic elements in any of the packages described herein can embody a greater number of active devices to provide memory storage array function than any other function, e.g., as flash memory, DRAM or other type of memory, and can be arranged in a package together with another microelectronic element or "logic chip" that is configured to predominantly provide logic function. In a particular embodiment, the logic chip can be a programmable or processor element such as a microprocessor or other general purpose computing element. The logic chip can be a microcontroller element, graphics processor, floating point processor, co-processor, digital signal processor, etc. In a particular embodiment, the logic chip can predominantly perform hardware state machine functions, or otherwise be hard-coded to serve a particular function or purpose. Alternatively, the logic chip can be an application specific integrated circuit ("ASIC") or field programmable gate array ("FPGA") chip. In such variation, the package then may be a "system in a package" ("SIP").

In another variation, a microelectronic element in any of the packages described herein can have both logic and memory function embedded therein, such as a programmable processor having one or more associated memory storage arrays embedded therewith in the same microelectronic element. Such microelectronic element is sometimes referred to as a "system-on-a-chip" ("SOC"), in that logic such as a processor is embedded together with other circuitry such as a memory storage array or circuitry for performing some other function that may be a specialized function.

In a particular example, each of the microelectronic elements 30 can be functionally and mechanically equivalent to the other ones of the microelectronic elements, such that each microelectronic element can have the same pattern of electrically conductive contacts 35 at the front surface 31 with the same function, although the particular dimensions of the length, width, and height of each microelectronic element can be different than that of the other microelectronic elements.

Each microelectronic element 30 can have a plurality of electrically conductive contacts 35 exposed at the front surface 31 thereof. The contacts 35 of each microelectronic element 30 can be arranged in one or more columns disposed in a central region 36 of the front surface 31 that occupies a central portion of an area of the front surface. The central region 36, for example, may occupy an area of the front surface 31 that includes a middle third of the shortest distance between opposed peripheral edges 32a, 32b of the microelectronic element 30. As shown in FIG. 1B, the contacts 35 of each microelectronic element 30 can be aligned with at least one of the apertures 26.

In a particular embodiment, the microelectronic package 10 can have four microelectronic elements 30, the contacts 35 of each microelectronic element including eight data I/O contacts. In another embodiment, the microelectronic package 10 can have four microelectronic elements 30, the contacts 35 of each microelectronic element including sixteen data I/O contacts. In a particular example, the microelectronic package 10 (and any of the other microelectronic packages described herein) can be configured to transfer, i.e., receive by the package, or transmit from the package thirty-two data bits in parallel in a clock cycle. In another example, the microelectronic package 10 (and any of the other microelectronic packages described herein) can be configured to transfer sixty-four data bits in parallel in a clock cycle. A number of other data transfer quantities are possible, among which only a few such transfer quantities will be mentioned without limitation. For example, the microelectronic package 10 (and any of the other microelectronic packages described herein) can be configured to transfer seventy-two data bits per clock cycle that can include a set of sixty-four underlying bits that represent data and eight bits that are error correction code ("ECC") bits for the sixty-four underlying bits. Ninety-six data bits, 108 bits (data and ECC bits), 128 data bits, and 144 bits (data and ECC bits) are other examples of data transfer widths per cycle that the microelectronic package 10 (and any of the other microelectronic packages described herein) can be configured to support.

In the embodiment of FIGS. 1A-1C, at least some signals that pass through the first terminals 25a of the package can be common to at least two of the microelectronic elements 30. These signals can be routed through connections such as conductive traces extending in a direction parallel to the second surface 22 of the substrate 20 from the first terminals 25a to the corresponding contacts 35 of the microelectronic elements 30. The microelectronic package 10 can route a signal that is common to multiple microelectronic elements 30 through a common first terminal 25a of the package, rather than through two or more terminals of the package each dedicated to a specific one of the microelectronic elements. In this way, an amount of area of the substrate 20 occupied by such terminals 25 can be reduced.

FIG. 1A illustrates a particular arrangement of microelectronic elements 30a, 30b, 30c, and 30d on a substrate 20 similar to the shape of a pinwheel. In this case, at least some of the plurality of contacts 35 of each microelectronic element 30 can be arranged in a respective column of contacts defining respective first, second, third, and fourth axis 29a, 29b, 29c, and 29d (collectively axes 29). In the example shown in FIG. 1A, the first and third axes 29a and 29c can be parallel to one another, the second and fourth axes 29b and 29d can be parallel to one another, and the first and third axes can be transverse to the second and fourth axes. In a particular embodiment, the first and third axes 29a and 29c can be orthogonal to the second and fourth axes 29b and 29d. In one example, each of the first, second, third and fourth axes 29a, 29b, 29c, and 29d, can be defined by a length of a corresponding one of the apertures 26a, 26b, 26c, and 26d, so that the apertures 26 can be arranged in a pinwheel configuration as described above.

In the particular example shown in FIG. 1A, the axis 29 of each microelectronic element 30 can bisect the respective microelectronic element and can intersect the area of exactly one other microelectronic element in the microelectronic package 10. For example, the first axis 29a can bisect the first microelectronic element 30a and can intersect the area of exactly one other microelectronic element 30. Similarly, the second axis 29b can bisect the second microelectronic element 30b and can intersect the area of exactly one other microelectronic element 30. The same is also true of the third axis 29c which can bisect the third microelectronic element 30c and can intersect the area of exactly one other microelectronic element 30. Indeed, this is also true of the fourth axis 29d that can bisect the fourth microelectronic element 30d and can intersect the area of exactly one other microelectronic element 30.

Electrical connections between the contacts 35 and the terminals 25 can include optional leads, e.g., wire bonds 40, or other possible structure in which at least portions of the leads are aligned with at least one of the apertures 26. For example, as seen in FIG. 1B, at least some of the electrical connections can include a wire bond 40 that extends beyond an edge of an aperture 26 in the substrate, and is joined to the contact 35 and a conductive element 24 of the substrate. In one embodiment, at least some of the electrical connections can include lead bonds. Such connections can include leads that extend along either or both of the first and second surfaces 21, 22 of the substrate 20 between the conductive elements 24 and the terminals 25. In a particular example, such leads can be electrically connected between the contacts 35 of each microelectronic element 30 and the terminals 25, each lead having a portion aligned with at least one of the apertures 26.

In one example, one or more additional chips 30' can be mounted to the substrate 20 having a surface 31' facing the first surface 21 (FIG. 1A) or the second surface 22 of the substrate 20. Such an additional chip 30' can be flip-chip bonded to electrically conductive contacts exposed at the first surface 21 of the substrate 20.

One or more of the additional chips 30' can be a buffering chip that can be configured to help provide signal isolation for each of the microelectronic elements 30 with respect to components external to the microelectronic package 10. In one example, such a buffering chip or buffer element can be electrically connected to at least some of the terminals 25 and one or more of the microelectronic elements 30 in the microelectronic package 10, the buffer element configured to regenerate at least one signal received at one or more of the terminals of the microelectronic package 10. In one embodiment, wherein the microelectronic package 10 is a registered DIMM, the at least one signal can include all of the command signals, address signals, bank address signals, and clock signals transferred to the package, the command signals being write enable, row address strobe, and column address strobe signals, and the clock signals being sampling clocks used for sampling the address signals. In a particular example, when the microelectronic package 10 is a load-reduced DIMM ("LRDIMM"), the at least one signal can include all of the data signals received by the microelectronic package.

In a particular embodiment, one or more of the additional chips 30' can be a decoupling capacitor. One or more decoupling capacitors can be disposed between the microelectronic elements 30 instead of or in addition to the aforementioned buffering chips. Such decoupling capacitors can be electrically connected to internal power and ground buses inside the microelectronic package 10.

In one embodiment, one of the additional chips 30' can be a nonvolatile memory element such as an electrical erasable programmable read only memory ("EEPROM") mounted to the substrate 20 and configured to permanently store identifying information of the microelectronic package 10, such as the data width and depth of the microelectronic package. Such a nonvolatile memory element can be electrically connected to one or more of the microelectronic elements 30.

In one example, one of the additional chips 30' can be a temperature sensor. Such a temperature sensor can be electrically connected to one or more of the microelectronic elements 30. In one example, the temperature sensor can include a diode and can be mounted to the substrate 20. In a particular embodiment, one of the additional chips 30' can be a serial presence detect element mounted to the substrate 20.

The microelectronic package 10 can further include an adhesive 12 between the front surface 31 of the microelectronic elements 30 and the first surface 21 of the substrate 20. The microelectronic package 10 can also include an encapsulant (not shown) that can optionally cover, partially cover, or leave uncovered the rear surfaces 32 of the microelectronic elements 30. For example, in the package shown in FIGS. 1A-1C, an encapsulant can be flowed, stenciled, screened or dispensed onto the rear surfaces 32 of the microelectronic elements 30. In another example, the encapsulant can be a mold compound which is formed thereon by overmolding.

In variations of the embodiments described above it is possible for the contacts of microelectronic elements to not be disposed in central regions of the surfaces thereof. Rather, the contacts may be disposed in one or more rows adjacent an edge of such microelectronic element. In another variation, the contacts of a microelectronic element can be disposed adjacent two opposed edges of such microelectronic element. In yet another variation, the contacts of a microelectronic element can be disposed adjacent any two edges, or be disposed adjacent more than two edges of such microelectronic element. In such cases, locations of apertures in the substrate can be modified to correspond to such locations of the contacts disposed adjacent such edge or edges of the microelectronic element.

Figure 2A:
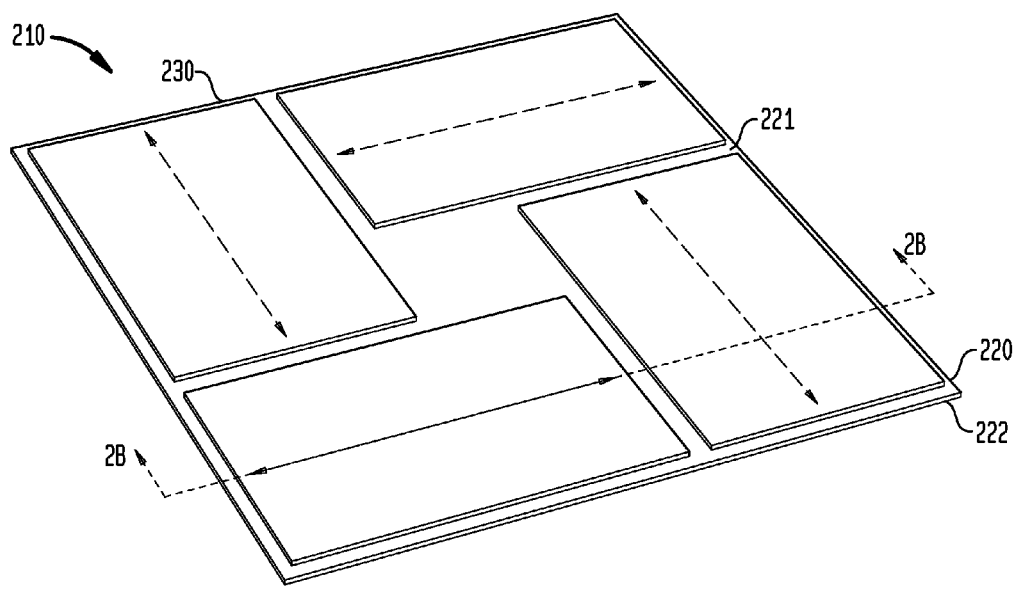
FIG. 2A is a diagrammatic perspective view of a microelectronic package according to another embodiment having microelectronic elements flip-chip mounted to a substrate.
Figure 2B:
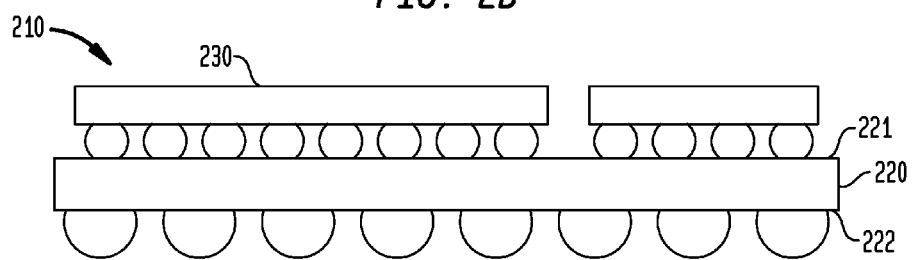
FIG. 2B is a side sectional view of the microelectronic package of FIG. 2A, taken along the line 2B-2B of FIG. 2A.

FIGS. 2A and 2B illustrate a variation of the embodiment described above relative to FIGS. 1A-1C, in which the microelectronic elements 230 are flip-chip bonded to the first surface 221 of the substrate 220. In such an embodiment, electrical connections between the microelectronic elements 230 and the substrate 220 include flip-chip connections extending between contacts of each of the microelectronic elements and conductive bond pads exposed at the first surface 221 of the substrate.

Figure 2C:
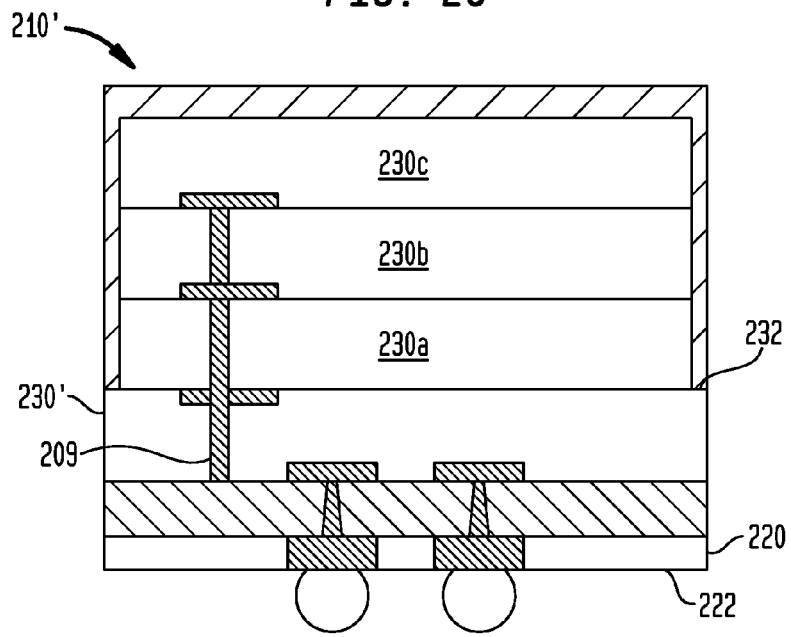
FIGS. 2C and 2D are side sectional views of variations of the microelectronic package of FIG. 2A, having one or more upper microelectronic elements at least partially overlying corresponding lower microelectronic elements.

FIG. 2C shows a variation of the embodiment described above relative to FIGS. 2A and 2B, in which one or more of the microelectronic elements 230 is a lower microelectronic element 230', and the microelectronic package 210' includes upper microelectronic elements 230a, 230b, and 230c each having a surface at least partially overlying a rear surface 232 of the lower microelectronic element. As shown in FIG. 2C, the upper microelectronic elements 230a, 230b, and 230c are electrically connected with the lower microelectronic element 230' through at least one conductive via 209 extending through the lower microelectronic element. In a particular embodiment, the lower microelectronic element 230" can be wire-bonded to conductive contacts exposed at the second surface 222 of the substrate 220.

Figure 2D:
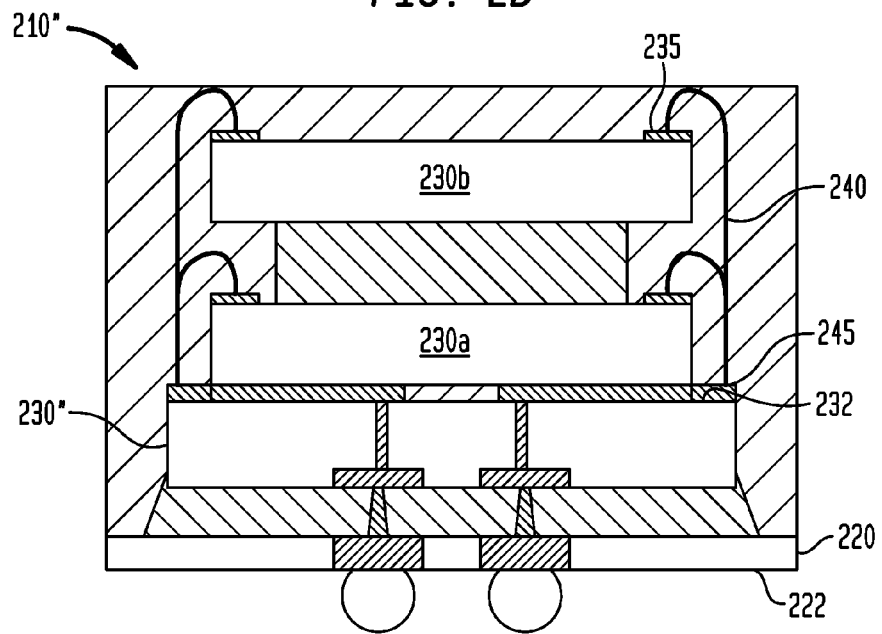

FIG. 2D shows a variation of the embodiment described above relative to FIGS. 2A and 2B, in which one or more of the microelectronic elements 230 is a lower microelectronic element 230", and the microelectronic package 210" includes upper microelectronic elements 230a and 230b each having a surface at least partially overlying a rear surface 232 of the lower microelectronic element. As shown in FIG. 2D, the upper microelectronic elements 230a and 230b are electrically connected with the lower microelectronic element 230" through wire bonds 240 extending between contacts 235 of the upper microelectronic elements and conductive elements 245 exposed at the rear surface 232 of the lower microelectronic element 230". In a particular embodiment, the lower microelectronic element 230" can be wire-bonded to conductive contacts exposed at the second surface 222 of the substrate 220.

FIGS. 3A-3D show additional variations of the microelectronic package 10 shown in FIGS. 1A-1C having different locations of the microelectronic elements relative to the first surface of the substrate. In FIGS. 3A-3D, the respective microelectronic packages 301, 302, 303, and 304 can each include four microelectronic elements 330, each microelectronic element having contacts that are wire-bonded through a respective aperture 326 to conductive contacts exposed at the second surface of the substrate 320. The apertures 326 can define portions of the boundary of a central region 323 of the second surface of the substrate, where shared first terminals connected to at least two of the microelectronic elements 330 can be located.

Figure 3A:
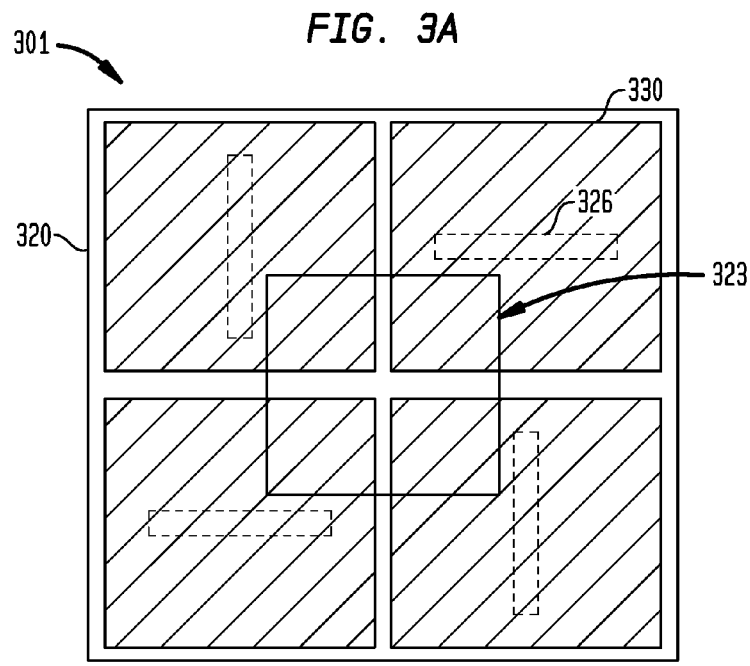

In FIG. 3A, the microelectronic package 301 has microelectronic elements 330 arranged similarly to the microelectronic elements 30 of FIGS. 1A-1C, but the microelectronic elements 330 each have a substantially square shape, so there is very little space at the first surface of the substrate 320 located between the microelectronic elements.

Figure 3B:
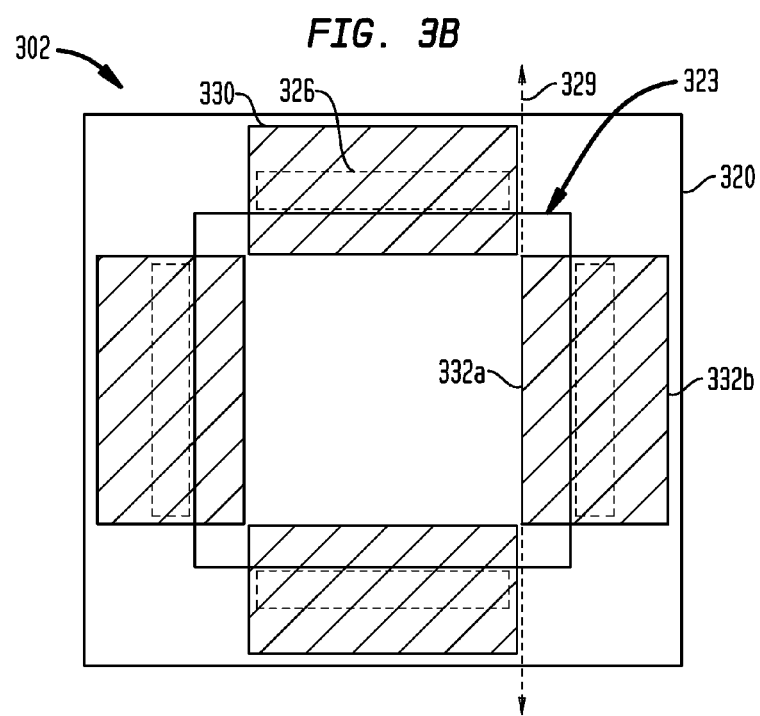

In FIG. 3B, each of the microelectronic elements 330 has first and opposed edges 332a and 332b oriented parallel to a length of the respective aperture 326. The first edge 332a of each of the microelectronic elements 330 can define an axis 329 that does not extend through the areas of any of the other microelectronic elements. In such an embodiment, there is a larger space at the first surface of the substrate 320 located between the microelectronic elements 330, and the central region 323 of the second surface of the substrate can be relatively large.

In FIG. 3C, each of the microelectronic elements 330 can overlie a respective aperture 326 that defines an axis 329 that does not extend through the areas of any of the other microelectronic elements. However, compared to FIG. 3B, two of the microelectronic elements 330a and 330c have been moved closer to a center of the first surface of the substrate 320. Each of the microelectronic elements 330 has first and opposed edges 332a and 332b oriented parallel to a length of the respective aperture 326. The first edge 332a of the first and third microelectronic elements 330a and 330c can define respective axes 329a and 329c that extend through the areas of the second and fourth microelectronic elements 330b and 330d.

FIG. 3D is a variation of FIG. 3C where two of the microelectronic elements 330a and 330c have been moved even closer to a center of the first surface of the substrate 320. The first and third microelectronic elements 330a and 330b can overlie a respective aperture 326a and 326c that defines a respective axis 329 and 329' that extends through the areas of the second and fourth microelectronic elements 330b and 330d. Also, each of the microelectronic elements 330 has first and opposed edges 332a and 332b oriented parallel to a length of the respective aperture 326. The first edge 332a of the first and third microelectronic elements 330a and 330c can define respective axes 329a and 329c that also extend through the areas of the second and fourth microelectronic elements 330b and 330d.

FIGS. 4A and 4B show additional variations of the microelectronic package 10 shown in FIGS. 1A-1C having three microelectronic elements having front surfaces arranged in a single plane parallel to the first surface of the substrate 420. In FIG. 4A, the microelectronic package 401 has three microelectronic elements 430 mounted to the first side of the substrate 410. A first one of the microelectronic elements 430a can have additional microelectronic elements at least partially overlying and electrically connected with the first microelectronic element, for example, in a manner such as that shown in FIG. 2C or FIG. 2D. A second one of the microelectronic elements 430b can be a controller, for example. In FIG. 4B, the microelectronic package 402 is the same as the microelectronic package 10 shown in FIGS. 1A-1C, except that one of the microelectronic elements 430 in the pinwheel configuration is omitted, leaving three microelectronic elements having front surfaces arranged in a single plane parallel to the first surface of the substrate 420.

Figure 5A:
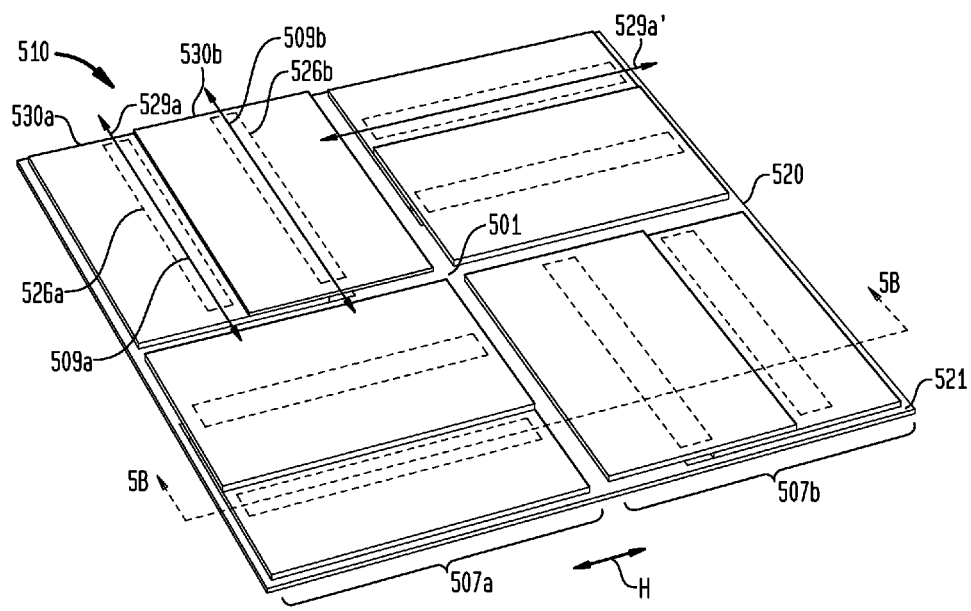
FIG. 5A is a diagrammatic perspective view of a microelectronic package according to yet another embodiment having stacked microelectronic elements.
Figure 5B:
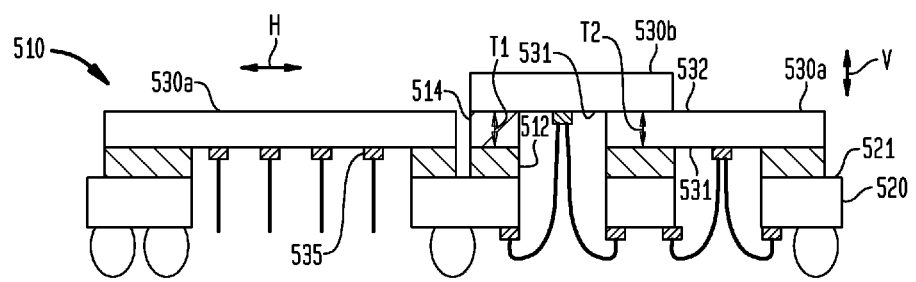
FIG. 5B is a side sectional view of the microelectronic package of FIG. 5A, taken along the line 5B-5B of FIG. 5A.
Figure 5C:
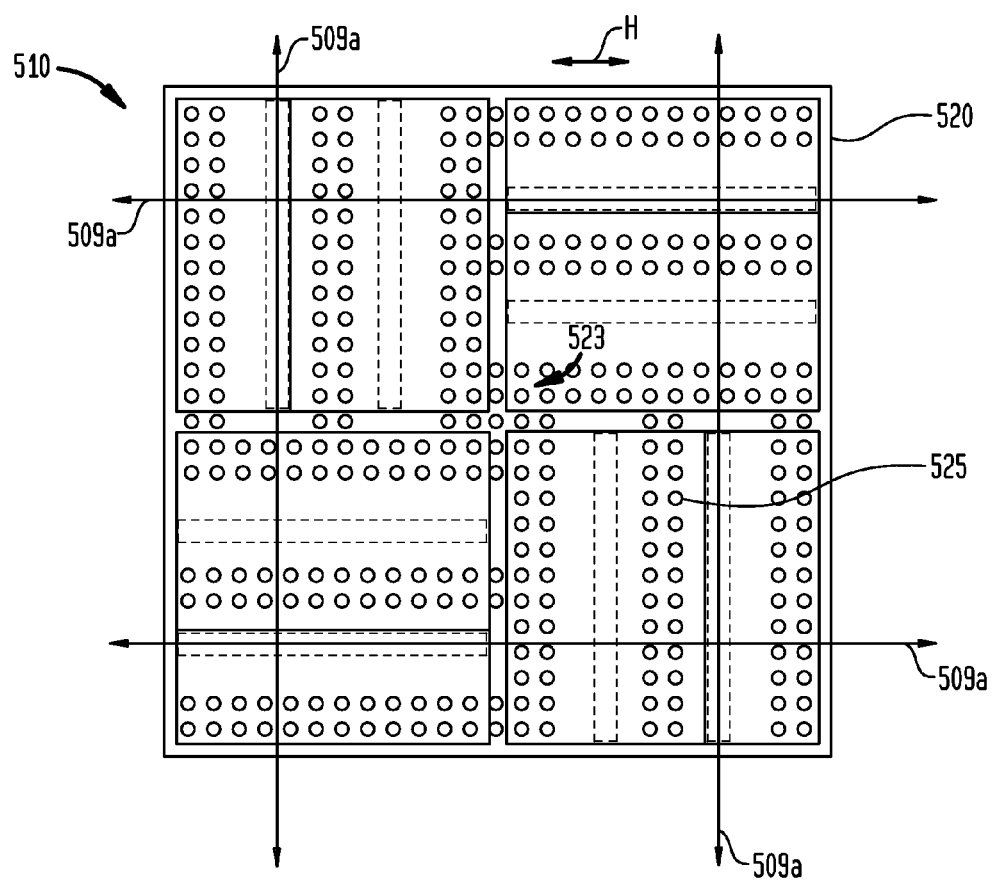
FIG. 5C is a bottom view of the microelectronic package of FIG. 5A, showing the location of the microelectronic elements.

FIGS. 5A-5C illustrate a variation of the embodiment described above relative to FIGS. 1A-1C. The microelectronic package 510 is similar to the microelectronic package 10 shown in FIGS. 1A-1C, except that in the microelectronic package 510, the front surface 531 of an upper microelectronic element 530b at least partially overlies a rear surface 532 of each of the four lower microelectronic elements 530a. The lower microelectronic elements 530a and the upper microelectronic elements 530b can be arranged in pairs 507 of microelectronic elements. Adjacent pairs 507 of microelectronic elements, such as a first pair 507a and a second pair 507b can be fully spaced apart from one another in a horizontal direction H parallel to the first surface 521 of the substrate 520. In a particular example, the microelectronic elements 530a and 530b can together embody a greater number of active devices to provide memory storage array function than any other function.

In one embodiment, the microelectronic package 510 can have eight microelectronic elements 530 (including four lower microelectronic elements 530a and four upper microelectronic elements 530b), each microelectronic element including eight data I/O contacts. In another embodiment, the microelectronic package 510 can have eight microelectronic elements 530 (including four lower microelectronic elements 530a and four upper microelectronic elements 530b), each microelectronic element including nine data I/O contacts.

In a particular example, at least some of the electrically conductive contacts 535 exposed at the front surface 531 of the lower microelectronic element 530a of adjacent pairs of microelectronic elements can be arranged in respective columns of contacts defining first and second axes 529a and 529a'. As shown in FIG. 5A, such first and second axes 529a and 529a' can be transverse to one another. In a particular example, the first and second axes 529a and 529a' can be orthogonal to one another. In one embodiment, the first and second axes 529a and 529a' can be parallel to one another.

In one embodiment, each pair of microelectronic elements 507 can at least partially overlie an outer aperture 526a extending between the first and second surfaces 521, 522 of the substrate 520. Each outer aperture 526a can have a length defining an outer axis 509a. The four outer axes 509a can be arranged in a pinwheel configuration as described above, wherein the outer axes 509a can be arranged in two parallel pairs of outer axes, each pair being transverse to the other pair. A central region 523 occupying a central portion of the second surface 522 of the substrate 520 can be bounded by the four outer axes 509a, as shown in FIG. 5C. At least some of the terminals 525 exposed at in the central region 523 of the second surface 522 of the substrate 520 can be first terminals having a function similar to the first terminals 25a described above.

In an exemplary embodiment, each pair of microelectronic elements 507 can also at least partially overlie an inner aperture 526b extending between the first and second surfaces 521, 522 of the substrate 520 adjacent a corresponding one of the outer apertures 526a in the same pair of microelectronic elements, as shown in FIG. 5A. Each inner aperture 526b can have a length defining an axis 509b that is closer to a centroid 501 of the substrate than the axis 509a defined by the length of the corresponding one of the outer apertures 526a.

As shown in FIG. 5A, each lower microelectronic element 530a overlies an outer aperture 526a, and each upper microelectronic element 530b overlies an inner aperture 526b. In a particular embodiment, each upper microelectronic element 530b can overlie an outer aperture 526a, and each lower microelectronic element 530a can overlie an inner aperture 526b. In one example, one or more of the lower microelectronic elements 530a can overlie corresponding outer apertures 526a, and the other lower microelectronic elements can overlie corresponding inner apertures 526b, while one or more of the upper microelectronic elements 530b can overlie corresponding outer apertures, and the other upper microelectronic elements can overlie corresponding inner apertures.

A spacer 514 can be positioned between the front surface 531 of the upper microelectronic elements 530b and a portion of the first surface 521 of the substrate 520, with or without an adhesive 512 located between the spacer and the first surface of the substrate. Such a spacer 514 can be made, for example, from a dielectric material such as silicon dioxide, a semiconductor material such as silicon, or one or more layers of adhesive. If the spacer 514 includes adhesives, the adhesives can connect the upper microelectronic elements 530b to the substrate 520. In one embodiment, the spacer 514 can have substantially the same thickness T1 in a vertical direction V substantially perpendicular to the first surface 521 of the substrate 520 as the thickness T2 of the lower microelectronic elements 530a between the front and rear surfaces 531, 532 thereof. In a particular embodiment, for example, when the spacer 514 is made of an adhesive material, the spacer 514 can be used without an adhesive 512 such as the adhesive 12 described above.

Figure 6A:
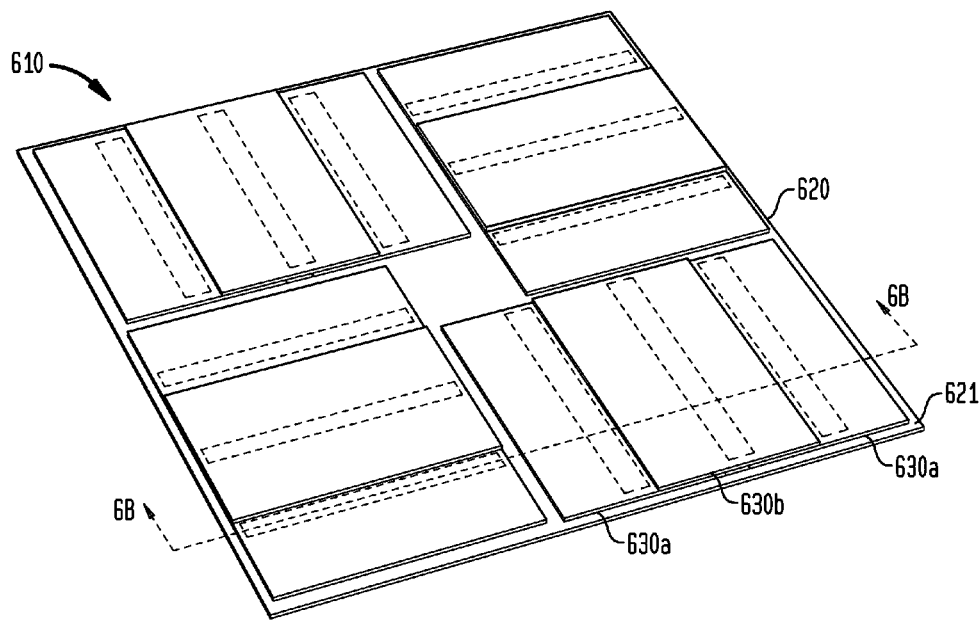
FIG. 6A is a diagrammatic perspective view of a microelectronic package according to yet another embodiment having stacked microelectronic elements.
Figure 6B:
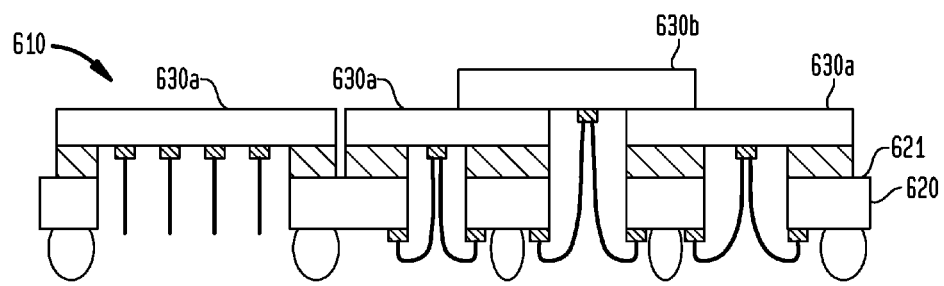
FIG. 6B is a side sectional view of the microelectronic package of FIG. 6A, taken along the line 6B-6B of FIG. 6A.
Figure 6C:
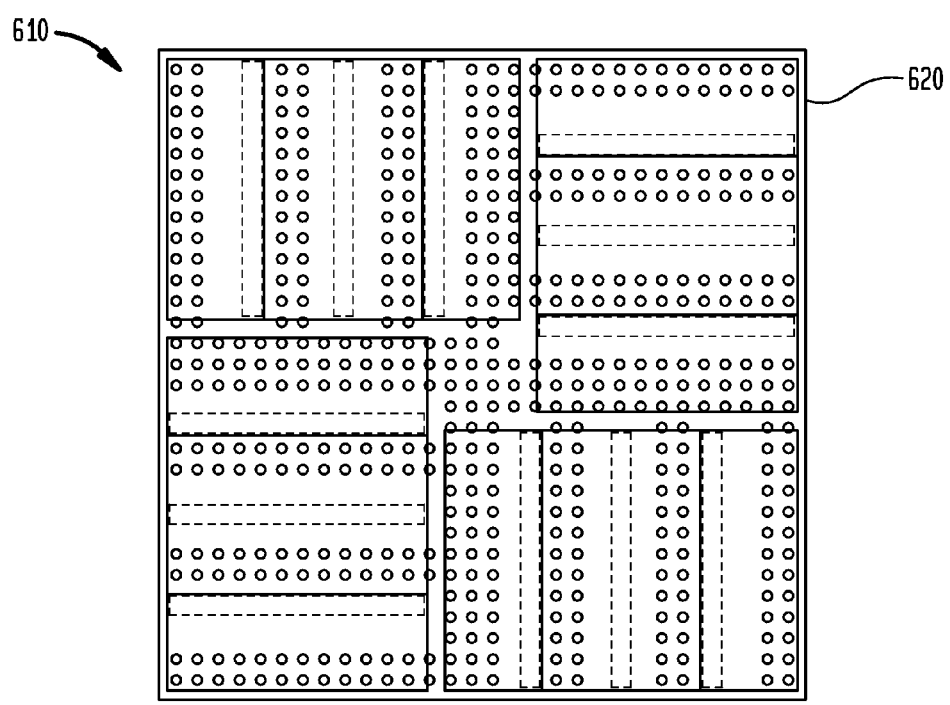
FIG. 6C is a bottom view of the microelectronic package of FIG. 6A, showing the location of the microelectronic elements.

FIGS. 6A-6C illustrate a variation of the embodiment described above relative to FIGS. 5A-5C. The microelectronic package 610 is similar to the microelectronic package 510 shown in FIGS. 5A-5C, except that in the microelectronic package 610, the front surface 631 of an upper microelectronic element 630b at least partially overlies a rear surface 632 of two lower microelectronic elements 630a. All of the lower microelectronic elements 630a can have front surfaces 631 arranged in a single plane parallel to the first surface 621 of the substrate 620.

Figure 7:
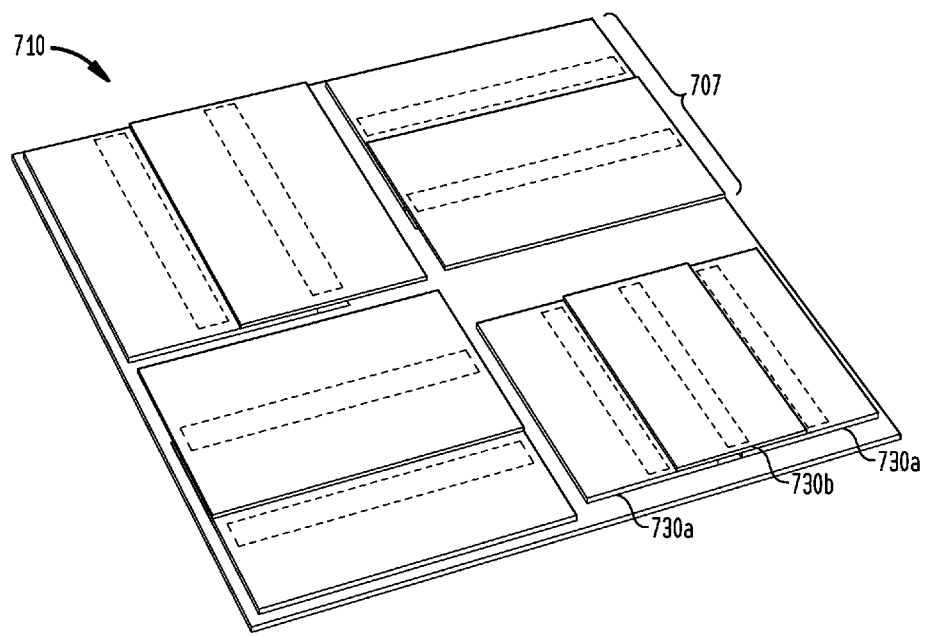
FIG. 7 is a diagrammatic perspective view of a microelectronic package according to still another embodiment having stacked microelectronic elements.

FIG. 7 illustrates another variation of the embodiment described above relative to FIGS. 5A-5C. The microelectronic package 710 is the same as the microelectronic package 510 shown in FIGS. 5A-5C, except microelectronic package 710 includes three pairs 707 of microelectronic elements, each pair having a lower microelectronic element 730a and an upper microelectronic element 730b. In place of a fourth pair 707 of microelectronic elements, the microelectronic package 710 includes a grouping of two lower microelectronic elements 730a and one corresponding upper microelectronic element 730b having a front surface 731 at least partially overlying rear surfaces 732 of each of the upper microelectronic elements. In one example, the microelectronic package 710 can have nine microelectronic elements 730 each including eight data I/O contacts.

Figure 8A:
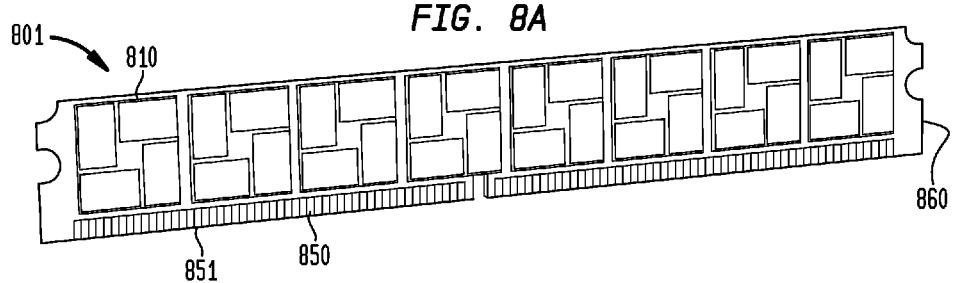
FIG. 8A is a diagrammatic perspective view of a microelectronic assembly having a plurality microelectronic packages mounted to a circuit panel.
Figure 8B:
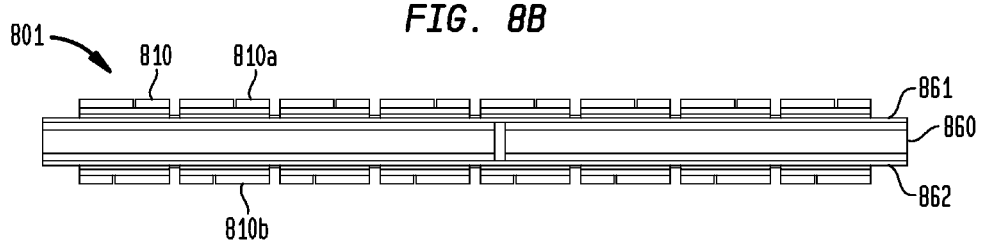
FIG. 8B is a bottom view of the microelectronic assembly of FIG. 8A.

Referring now to FIGS. 8A and 8B, a microelectronic assembly 801 can include a plurality of microelectronic packages 810 that can be mounted to a common circuit panel 860. Each of the microelectronic packages 810 is shown as a microelectronic package 10 from FIGS. 1A-1C, but such microelectronic packages 810 can be any of the microelectronic packages described above with reference to FIGS. 1A through 7. The circuit panel 860 can have first and second opposing surfaces 861 and 862 and pluralities of electrically conductive panel contacts exposed at the respective first and second surfaces. The microelectronic packages 810 can be mounted to the panel contacts, for example, by the joining elements 11 shown in FIG. 1B that can extend between the terminals of each microelectronic package and the panel contacts. As shown in FIG. 8B, the second surface of the substrate of the a first microelectronic package 810a and the second surface of the substrate of a second microelectronic package 810b can at least partially overlie one another. In a particular example, the circuit panel 860 can include an element having a CTE less than 30 ppm/° C. In one embodiment, such an element can consist essentially of semiconductor, glass, ceramic or liquid crystal polymer material.

In a particular embodiment, the circuit panel 860 can have a plurality of parallel exposed edge contacts 850 adjacent an insertion edge 851 of at least one of the first and second surfaces 861, 862 for mating with corresponding contacts of a socket (shown in FIG. 9) when the microelectronic assembly 801 is inserted in the socket. Some or all of the edge contacts 850 can be exposed at either or both of the first or second surfaces 861, 862 of the microelectronic assembly 801. In one example, the circuit panel 860 can be a motherboard. In an exemplary embodiment, the circuit panel 860 can be a module such as a memory subsystem that can be configured to be attached to another circuit panel such as a motherboard. Such attachment of the circuit panel 860 to another circuit panel can be as described below.

The exposed edge contacts 850 and the insertion edge 851 can be sized for insertion into a corresponding socket (FIG. 9) of other connector of a system, such as can be provided on a motherboard. Such exposed edge contacts 850 can be suitable for mating with a plurality of corresponding spring contacts (FIG. 9) within such socket connector. Such spring contacts can be disposed on single or multiple sides of each slot to mate with corresponding ones of the exposed edge contacts 850. In one example, at least some of the edge contacts 850 can be usable to carry at least one of a signal or a reference potential between the respective edge contact and one or more of the microelectronic packages 810. In a particular embodiment, the microelectronic assembly 801 can have the same signal interface as a dual in-line memory module.

Figure 8C:
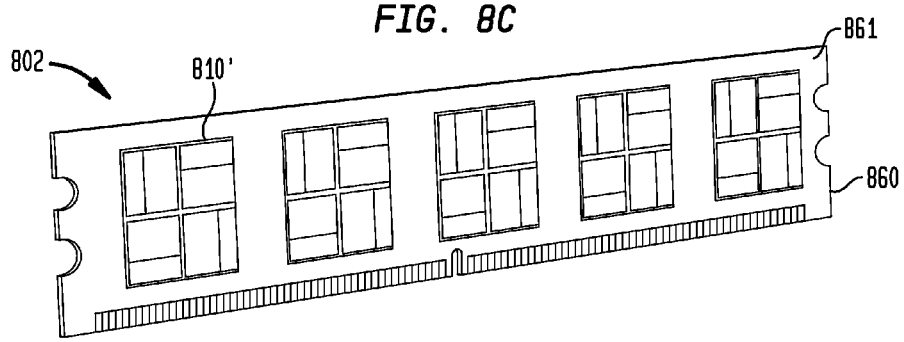
FIG. 8C-8E are diagrammatic perspective views of microelectronic assemblies according to further embodiments having a plurality microelectronic packages mounted to a circuit panel.
Figure 8D:
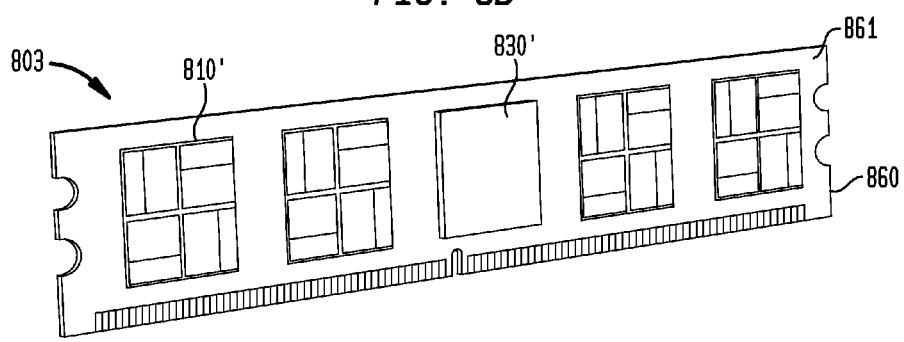
Figure 8E:
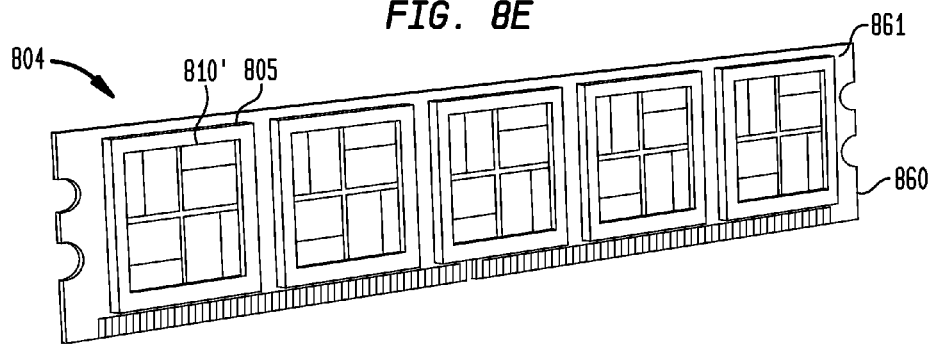

FIGS. 8C-8E show variations of the microelectronic assembly 801 shown in FIGS. 8A and 8B including microelectronic packages 810' that are shown as the microelectronic package 510 from FIGS. 5A-5C. In FIG. 8C, the microelectronic package 802 has five microelectronic packages 810' mounted to a first side 861 of the circuit panel 860.

In FIG. 8D, the microelectronic package 803 has five microelectronic packages 810' mounted to a first surface 861 of the circuit panel 860, and an additional chip 830' such as the additional chip 30' shown in FIG. 1A is shown having a surface facing the first surface of the circuit panel. Such an additional chip 830' can be any of the types of additional chips described above with reference to FIGS. 1A-1C, including, for example, a buffering chip that can be configured to help provide signal isolation for each of the microelectronic packages 810' with respect to components external to the microelectronic assembly 803. In one example, the additional chip 830' can include a memory controller.

In FIG. 8E, the microelectronic package 804 has five microelectronic packages 810' each mounted to a respective socket 805, and each socket is mounted to the first surface 861 of the circuit panel 860.

Figure 9:
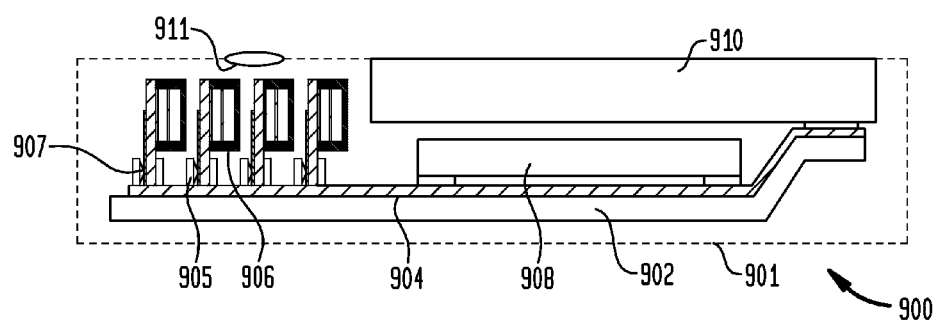
FIG. 9 is a schematic depiction of a system according to one embodiment including a plurality of modules.

The microelectronic packages and microelectronic assemblies described above with reference to FIGS. 1 through 8E can be utilized in construction of diverse electronic systems, such as the system 900 shown in FIG. 9. For example, the system 900 in accordance with a further embodiment of the invention includes a plurality of modules or components 906 such as the microelectronic packages and microelectronic assemblies as described above in conjunction with other electronic components 908 and 910.

The system 900 can include a plurality of sockets 905, each socket including a plurality of contacts 907 at one or both sides of the socket, such that each socket 905 can be suitable for mating with corresponding exposed edge contacts or exposed module contacts of a corresponding module or component 906. In the exemplary system 900 shown, the system can include a circuit panel or motherboard 902 such as a flexible printed circuit board, and the circuit panel can include numerous conductors 904, of which only one is depicted in FIG. 9, interconnecting the modules or components 906 with one another. Such a circuit panel 902 can transport signals to and from each of the microelectronic packages 10 or 110 included in the system 900. However, this is merely exemplary; any suitable structure for making electrical connections between the modules or components 906 can be used. In a particular example, rather than having the modules or components 906 coupled to the circuit panel 902 through sockets 905, one or more of the modules or components 906 such as the microelectronic package 10 can be mounted directly to the circuit panel 902.

In a particular embodiment, the system 900 can also include a processor such as the semiconductor chip 908, such that each module or component 906 can be configured to transfer a number N of data bits in parallel in a clock cycle, and the processor can be configured to transfer a number M of data bits in parallel in a clock cycle, M being greater than or equal to N.

In one example, the system 900 can include a processor chip 908 that is configured to transfer thirty-two data bits in parallel in a clock cycle, and the system can also include four modules 906 such as the module 10 described with reference to FIGS. 1A through 1C, each module 906 configured to transfer eight data bits in parallel in a clock cycle (i.e., each module 906 can include first and second microelectronic elements, each of the two microelectronic elements being configured to transfer four data bits in parallel in a clock cycle).

In another example, the system 900 can include a processor chip 908 that is configured to transfer sixty-four data bits in parallel in a clock cycle, and the system can also include four modules 906 such as the component 1000 described with reference to FIG. 9, each module 906 configured to transfer sixteen data bits in parallel in a clock cycle (i.e., each module 906 can include two sets of first and second microelectronic elements, each of the four microelectronic elements being configured to transfer four data bits in parallel in a clock cycle).

In the example depicted in FIG. 9, the component 908 is a semiconductor chip and component 910 is a display screen, but any other components can be used in the system 900. Of course, although only two additional components 908 and 910 are depicted in FIG. 9 for clarity of illustration, the system 900 can include any number of such components.

Modules or components 906 and components 908 and 910 can be mounted in a common housing 901, schematically depicted in broken lines, and can be electrically interconnected with one another as necessary to form the desired circuit. The housing 901 is depicted as a portable housing of the type usable, for example, in a cellular telephone or personal digital assistant, and screen 910 can be exposed at the surface of the housing. In embodiments where a structure 906 includes a light-sensitive element such as an imaging chip, a lens 911 or other optical device also can be provided for routing light to the structure. Again, the simplified system shown in FIG. 9 is merely exemplary; other systems, including systems commonly regarded as fixed structures, such as desktop computers, routers and the like can be made using the structures discussed above.

In any or all of the microelectronic packages described in the foregoing, the rear surface of one or more of the microelectronic elements can be at least partially exposed at an exterior surface of the microelectronic package after completing fabrication. Thus, in the microelectronic package 10 described above with respect to FIG. 1A, the rear surface 32 of the microelectronic elements 30 can be partially or fully exposed at an exterior surface of an encapsulant in the completed microelectronic package 10.

In any of the embodiments described above, the microelectronic package may include a heat spreader partly or entirely made of any suitable thermally conductive material. Examples of suitable thermally conductive material include, but are not limited to, metal, graphite, thermally conductive adhesives, e.g., thermally-conductive epoxy, a solder, or the like, or a combination of such materials. In one example, the heat spreader can be a substantially continuous sheet of metal.

In one embodiment, the heat spreader can include a metallic layer disposed adjacent to one or more of the microelectronic elements. The metallic layer may be exposed at the rear surface of the microelectronic element. Alternatively, the heat spreader can include an overmold or an encapsulant covering at least the rear surface of the microelectronic element. In one example, the heat spreader can be in thermal communication with at least one of the front surface and rear surface of each of the microelectronic elements such as the lower and/or upper microelectronic elements 530a, 530b shown in FIGS. 5A and 5B. The heat spreader can extend between adjacent edges of adjacent ones of the microelectronic elements. The heat spreader can improve heat dissipation to the surrounding environment.

In a particular embodiment, a pre-formed heat spreader made of metal or other thermally conductive material may be attached to or disposed on the rear surface of one or more of the microelectronic elements with a thermally conductive material such as thermally conductive adhesive or thermally conductive grease. The adhesive, if present, can be a compliant material that permits relative movement between the heat spreader and the microelectronic element to which it is attached, for example, to accommodate differential thermal expansion between the compliantly attached elements. The heat spreader may be a monolithic structure. Alternatively, the heat spreader may include multiple spreader portions spaced apart from one another. In a particular embodiment, the heat spreader may be or include a layer of solder joined directly to at least a portion of a rear surface of one or more of microelectronic elements such as the lower and/or upper microelectronic elements 530a, 530b shown in FIGS. 5A and 5B.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:
a substrate having first and second opposed surfaces;
at least two pairs of microelectronic elements, each pair of microelectronic elements including an upper microelectronic element and a lower microelectronic element, the pairs of microelectronic elements being fully spaced apart from one another in a horizontal direction parallel to the first surface of the substrate, each lower microelectronic element having a front surface facing the first surface of the substrate and a plurality of contacts at the front surface, the front surfaces of the lower microelectronic elements being arranged in a single plane parallel to the first surface, a surface of each of the upper microelectronic elements at least partially overlying a rear surface of the lower microelectronic element in its pair, the microelectronic elements together configured to predominantly provide memory storage array function;
a plurality of terminals exposed at the second surface, the terminals configured for connecting the microelectronic package to at least one component external to the microelectronic package; and
electrical connections extending from at least some of the contacts of each lower microelectronic element to at least some of the terminals,
wherein at least one of the upper or lower microelectronic elements of each pair of microelectronic elements at least partially overlies an aperture extending between the first and second surfaces of the substrate, and wherein each aperture has a length defining respective first and second axes, the first and second axes being transverse to one another.

2. The microelectronic package as claimed in claim 1, wherein the at least two pairs of microelectronic elements includes four pairs of microelectronic elements.

3. The microelectronic package as claimed in claim 1, wherein the lower microelectronic element of at least one of the pairs of the microelectronic elements is a first lower microelectronic element disposed adjacent a second lower microelectronic element, the front surface of the second lower microelectronic element being arranged in the single plane parallel to the first surface, and wherein the upper microelectronic element that at least partially overlies the first lower microelectronic element also at least partially overlies the second lower microelectronic element.

4. The microelectronic package as claimed in claim 1, wherein the electrical connections include flip-chip connections extending between contacts of each of the lower microelectronic elements and conductive bond pads exposed at the first surface of the substrate.

5. The microelectronic package as claimed in claim 1, wherein each of the lower microelectronic elements overlies at least one of the apertures extending between the first and second surfaces of the substrate, and wherein the electrical connections include leads having at least portions aligned with the at least one of the apertures.

6. The microelectronic package as claimed in claim 5, wherein each of the upper microelectronic elements overlies at least one of the apertures extending between the first and second surfaces of the substrate, and wherein the electrical connections include leads having at least portions aligned with the at least one of the apertures.

7. The microelectronic package as claimed in claim 5, wherein at least some of the leads include wire bonds extending through the at least one of the apertures.

8. The microelectronic package as claimed in claim 1, wherein the microelectronic elements are configured to function together as an addressable memory module, the microelectronic package configured to store part of data received in each of the microelectronic elements.

9. The microelectronic package as claimed in claim 8, wherein the microelectronic package is configured to function as a dual in-line memory module.

10. The microelectronic package as claimed in claim 9, wherein the microelectronic package has the same command and signal interface and is configured to transfer the same amount of data as a dual in-line memory module.

11. A microelectronic assembly including a plurality of microelectronic packages as claimed in claim 1, further comprising a circuit panel having panel contacts, wherein the terminals of the package are bonded to the panel contacts.

12. A module including a plurality of microelectronic assemblies as claimed in claim 11, each microelectronic assembly electrically coupled to a second circuit panel for transport of signals to and from each of the microelectronic assemblies.

13. A system comprising a microelectronic package according to claim 1, and one or more other electronic components electrically connected to the microelectronic package.

14. The system as claimed in claim 13, further comprising a housing, the microelectronic package and the other electronic components being mounted to the housing.

15. The microelectronic package as claimed in claim 1, further comprising a buffer element electrically connected to at least some of the terminals and one or more of the microelectronic elements in the microelectronic package, the buffer element configured to regenerate at least one signal received at one or more of the terminals of the microelectronic package, wherein the at least one signal includes all of the address signals transferred to the microelectronic package.

16. The microelectronic package as claimed in claim 15, wherein the at least one signal includes all of the command signals, address signals, bank address signals, and clock signals transferred to the microelectronic package, the command signals being write enable, row address strobe, and column address strobe signals, and the clock signals being sampling clocks used for sampling the address signals.

17. The microelectronic package as claimed in claim 15, wherein the at least one signal includes all of the data signals received by the microelectronic package.

18. The microelectronic package as claimed in claim 15, wherein the buffer element is mounted to the first surface of the substrate.

19. The microelectronic package as claimed in claim 15, wherein the buffer element is mounted to the second surface of the substrate.

* * * * *